US010727233B2

(12) United States Patent
Park

(10) Patent No.: US 10,727,233 B2
(45) Date of Patent: Jul. 28, 2020

(54) INTEGRATED CIRCUIT DEVICES AND METHODS OF FABRICATING THE SAME

(71) Applicant: Samsung Electronics Co., Ltd., Suwon-si (KR)

(72) Inventor: Seok-han Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/043,398

(22) Filed: Jul. 24, 2018

(65) Prior Publication Data

US 2019/0123051 A1 Apr. 25, 2019

(30) Foreign Application Priority Data

Oct. 20, 2017 (KR) ........................ 10-2017-0136601

(51) Int. Cl.
*H01L 29/06* (2006.01)
*H01L 27/108* (2006.01)
(Continued)

(52) U.S. Cl.
CPC .. *H01L 27/10885* (2013.01); *H01L 21/02118* (2013.01); *H01L 21/31144* (2013.01); *H01L 21/764* (2013.01); *H01L 21/7682* (2013.01); *H01L 21/76224* (2013.01); *H01L 21/76897* (2013.01); *H01L 21/823468* (2013.01); *H01L 23/485* (2013.01); *H01L 23/5222* (2013.01); *H01L 23/5329* (2013.01); *H01L 27/10855* (2013.01); *H01L 27/10882* (2013.01); *H01L 27/10894* (2013.01)

(58) Field of Classification Search
CPC .................................................. H01L 29/0649
See application file for complete search history.

(56) References Cited

U.S. PATENT DOCUMENTS 7,041,571 B2   5/2006   Strane
8,921,235 B2   12/2014  Thadani
(Continued)

FOREIGN PATENT DOCUMENTS

KR   1020120121795   11/2012
KR   1020130010298   1/2013
(Continued)

*Primary Examiner* — Peniel M Gumedzoe
*Assistant Examiner* — Christopher A Johnson
(74) *Attorney, Agent, or Firm* — Myers Bigel, P.A.

(57) ABSTRACT

An integrated circuit device includes: a conductive line structure including a conductive line and an insulating capping pattern; and an insulating spacer including an inner spacer and a first insulating spacer, the inner spacer and the first insulating spacer on a sidewall of the conductive line structure. The first insulating spacer includes: a slit portion; a lower insulating portion spaced apart from the inner spacer such that a separation distance between a portion of the lower insulating portion and the inner spacer decreases with increasing vertical distance from the substrate; and an upper insulating portion contacting the inner spacer. A method of forming the insulating spacer includes: forming a polymer layer on the inner spacer; forming a first insulating spacer layer which contacts each of the inner spacer and the polymer layer; and forming a first insulating spacer by partially removing the first insulating spacer layer.

20 Claims, 44 Drawing Sheets

(51) Int. Cl.
    *H01L 21/764*     (2006.01)
    *H01L 21/768*     (2006.01)
    *H01L 21/311*     (2006.01)
    *H01L 23/485*     (2006.01)
    *H01L 23/522*     (2006.01)
    *H01L 23/532*     (2006.01)
    *H01L 21/8234*    (2006.01)
    *H01L 21/762*     (2006.01)
    *H01L 21/02*      (2006.01)

(56) References Cited

U.S. PATENT DOCUMENTS

| | | |
|---|---|---|
| 9,312,220 B2 | 4/2016 | Lu |
| 9,627,514 B1 | 4/2017 | Kim |
| 2010/0248471 A1 | 9/2010 | Nam |
| 2012/0276711 A1 | 11/2012 | Yoon |
| 2013/0020719 A1 | 1/2013 | Jung |
| 2014/0367825 A1* | 12/2014 | Kim .................. H01L 29/0649 257/522 |
| 2019/0109138 A1* | 4/2019 | Chang ............... H01L 27/10885 |

FOREIGN PATENT DOCUMENTS

| | | |
|---|---|---|
| KR | 101517851 | 4/2015 |
| KR | 1020150063650 | 6/2015 |
| WO | WO2004103893 | 12/2004 |

\* cited by examiner

INTEGRATED CIRCUIT DEVICES AND METHODS OF FABRICATING THE SAME

CROSS-REFERENCE TO RELATED APPLICATION

This U.S. nonprovisional patent application claims priority under 35 U.S.C § 119 to Korean Patent Application No. 10-2017-0136601, filed on Oct. 20, 2017, in the Korean Intellectual Property Office, the entire contents of which are incorporated herein by reference.

BACKGROUND

The inventive concepts relate to integrated circuit devices and methods of fabricating the same, and, more particularly, to integrated circuit devices including a plurality of conductive patterns adjacent to each other, and methods of fabricating the same.

Due to the development of electronic technology, semiconductor devices have been rapidly down-scaled in recent years, and separation distances between a plurality of wiring lines and a plurality of contact plugs arranged therebetween in highly down-scaled semiconductor devices have gradually decreased. Thus, load capacitance between conductive patterns adjacent to each other has increased, thus adversely affecting the operation speed and/or refresh characteristics of semiconductor devices.

SUMMARY

The inventive concepts provide integrated circuit devices having a structure capable of minimizing load capacitance between a plurality of conductive patterns in a unit cell due to high integration, and methods of fabricating the integrated circuit devices.

According to an aspect of the inventive concepts, there is provided an integrated circuit device including: a conductive line structure including a conductive line and an insulating capping pattern that is on the conductive line, the conductive line extending in a first horizontal direction over a substrate; and an insulating spacer including an inner spacer and a first insulating spacer on the inner spacer, the inner spacer contacting a sidewall of the conductive line structure, and the first insulating spacer on the sidewall of the conductive line structure, wherein the first insulating spacer includes: a slit portion extending in the first horizontal direction on the substrate; a lower insulating portion extending long in the first horizontal direction between the substrate and the slit portion and spaced apart from the inner spacer such that a separation distance between a portion of the lower insulating portion and the inner spacer decreases with increasing vertical distance from the substrate; and an upper insulating portion contacting the inner spacer and spaced apart from the lower insulating portion with the slit portion therebetween.

According to another aspect of the inventive concepts, there is provided an integrated circuit device including: a pair of conductive line structures including a pair of conductive lines and a pair of insulating capping patterns that are on the pair of conductive lines, the pair of conductive lines extending in a first horizontal direction over a substrate; a plurality of contact structures arranged in a line between the pair of conductive line structures; and a plurality of insulating spacers arranged between the pair of conductive line structures and the plurality of contact structures, wherein each of the plurality of insulating spacers includes: an inner spacer contacting a sidewall of each conductive line structure; a slit portion extending in the first horizontal direction; an insulating pocket portion extending in the first horizontal direction between the substrate and the slit portion and spaced apart from the inner spacer such that a separation distance between a portion of the lower insulating portion and the inner spacer decreases with increasing vertical distance from the substrate; and an upper insulating portion contacting the inner spacer and spaced apart from the lower insulating portion with the slit portion therebetween.

According to yet another aspect of the inventive concepts, there is provided a method of fabricating an integrated circuit device, the method including: forming a conductive line structure on a substrate, the conductive line structure comprising a conductive line and an insulating capping pattern on the conductive line; forming an inner spacer on a sidewall of the conductive line structure; forming a polymer layer on the inner spacer, the polymer layer having a smaller height than the inner spacer and being on the sidewall of the conductive line structure with the inner spacer interposed between the conductive line structure and the polymer layer; forming a first insulating spacer layer contacting each of the polymer layer and the inner spacer on the sidewall of the conductive line structure; and forming a first insulating spacer by partially removing the first insulating spacer layer, the first insulating spacer having a slit portion that exposes the polymer layer.

According to yet another aspect of the inventive concepts, there is provided an integrated circuit device including: a conductive line structure including a conductive line and an insulating capping pattern that is on the conductive line, the conductive line extending in a first direction on a substrate; an inner spacer on a sidewall of the conductive line structure; and a first insulating spacer on the inner spacer. The first insulating spacer may include: a lower insulating portion extending in the first direction adjacent the conductive line; and an upper insulating portion extending in the first direction adjacent the insulating capping pattern. The lower insulating portion may be separated from the upper insulating portion by a gap, and a first distance between an upper portion of the lower insulating portion and the inner spacer may be less than a second distance between a lower portion of the lower insulating portion and the inner spacer.

According to yet another aspect of the inventive concepts, the integrated circuit device includes an insulating spacer between a conductive line structure and a contact structure, the insulating spacer including an air spacer or polymer spacer having an extremely low dielectric constant. Therefore, there can be provided a structure capable of minimizing load capacitance between a plurality of conductive patterns in a unit cell due to high integration. In addition, according to the method of fabricating an integrated circuit device, according to embodiments of the inventive concepts, in forming an air spacer between a conductive line structure and a conductive plug, the air spacer is formed before a metal silicide film and a conductive landing pad are formed on the conductive plug. Therefore, during the process of forming the air spacer, the spread of contamination due to the air spacer or surroundings thereof can be prevented, thereby preventing deterioration in the quality of the integrated circuit device.

BRIEF DESCRIPTION OF THE DRAWINGS

Embodiments of the inventive concepts will be more clearly understood from the following detailed description taken in conjunction with the accompanying drawings in which:

FIG. 2A is a cross-sectional view of a portion of the integrated circuit device, and FIGS. 2B to 2E are respectively plan views of partial regions of the integrated circuit device of FIG. 2A;

DETAILED DESCRIPTION

Figure 1:
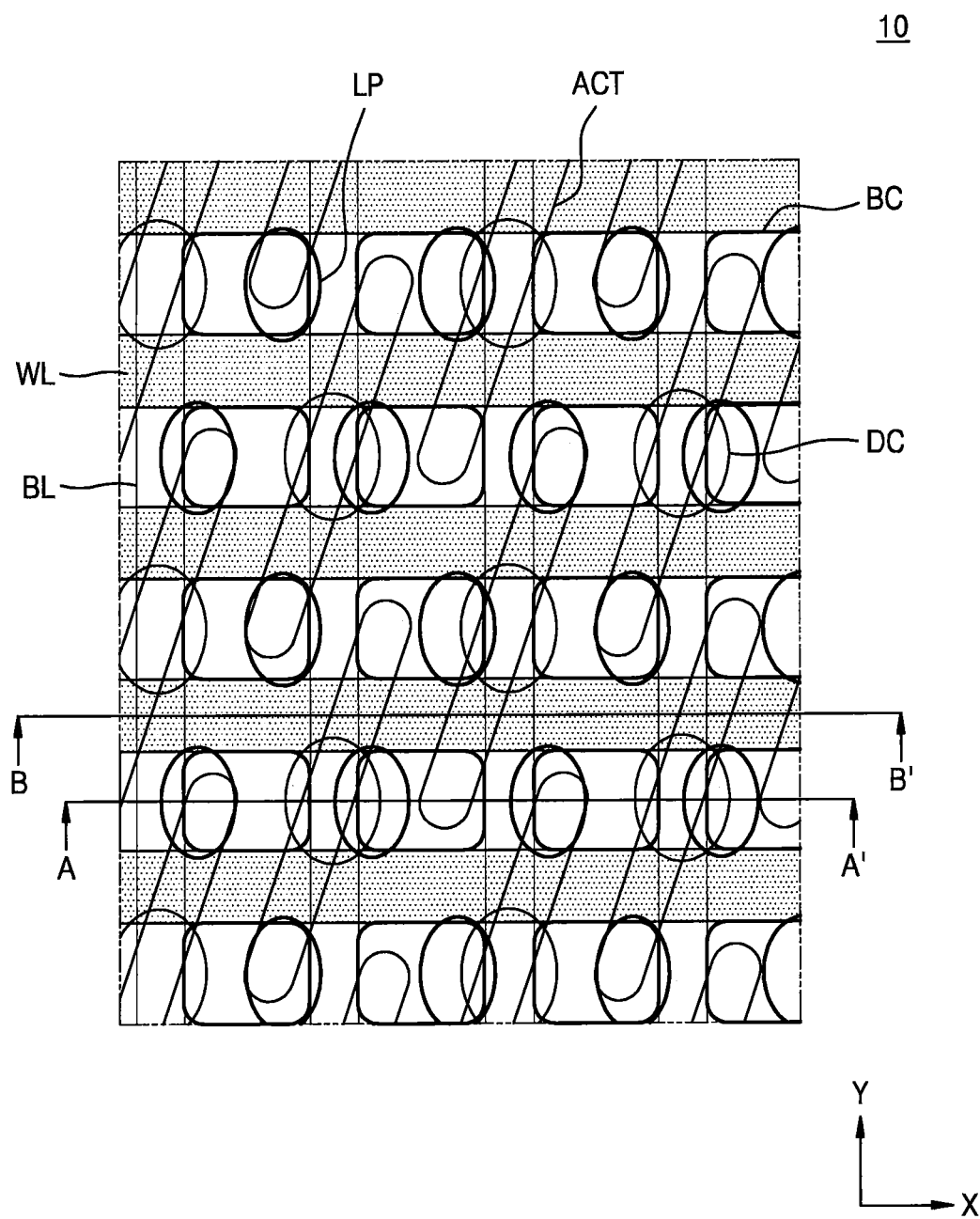
FIG. 1 is a schematic planar layout illustrating configurations of a memory cell array region of an integrated circuit device, according to embodiments of the inventive concepts.

Hereinafter, embodiments of the inventive concepts will be described in detail with reference to the accompanying drawings. Like components will be denoted by like reference numerals throughout the specification, and repeated descriptions thereof will be omitted.

FIG. 1 is a schematic planar layout illustrating configurations of a memory cell array region of an integrated circuit device 10 according to embodiments of the inventive concepts.

Referring to FIG. 1, in the integrated circuit device 10, a plurality of active regions ACT may be arranged to horizontally extend in an oblique direction with respect to an X direction and a Y direction on a plane. A plurality of word lines WL may extend parallel to each other along the X direction across the plurality of active regions ACT. On the plurality of word lines WL, a plurality of bit lines BL may extend parallel to each other along the Y direction intersecting the X direction. The plurality of bit lines BL may be connected to the plurality of active regions ACT via direct contacts DC.

A plurality of buried contacts BC may be formed between two bit lines BL adjacent to each other among the plurality of bit lines BL. A plurality of conductive landing pads LP may be formed on the plurality of buried contacts BC. The plurality of buried contacts BC and the plurality of conductive landing pads LP may connect bottom electrodes (not shown) of capacitors formed over the plurality of bit lines BL to the active regions ACT. Each of the plurality of conductive landing pads LP may be arranged to at least partially overlap a buried contact BC.

Figure 2A:
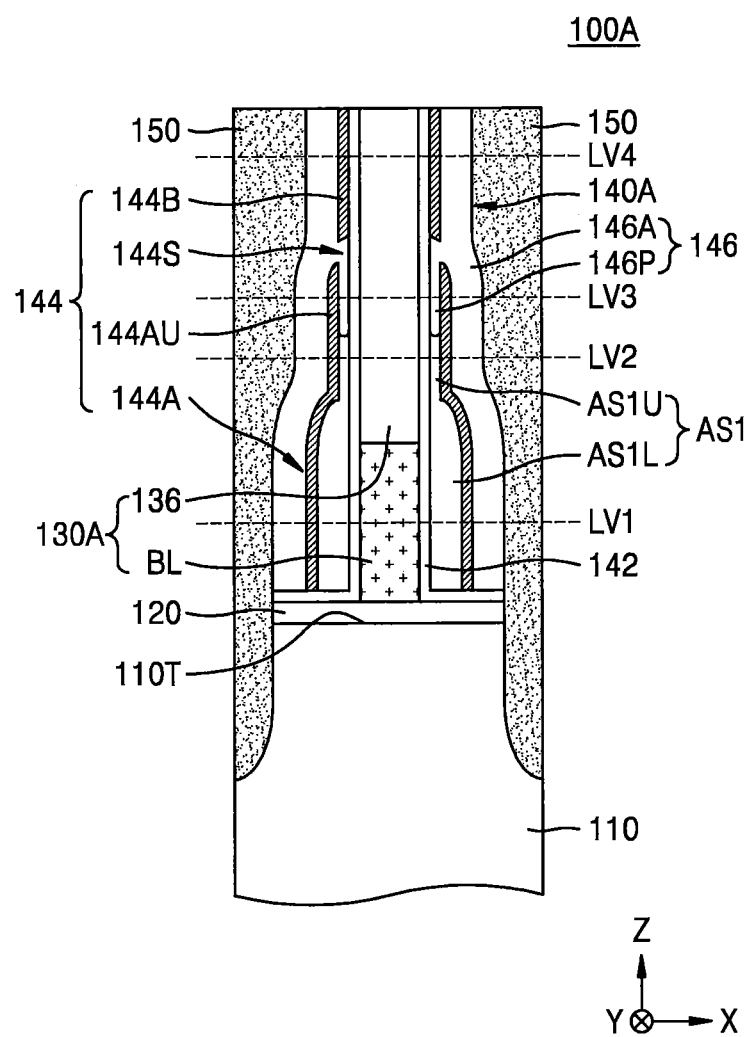
FIGS. 2A to 2E are diagrams illustrating an integrated circuit device according to embodiments of the inventive concepts, and in particular.
Figure 2B:
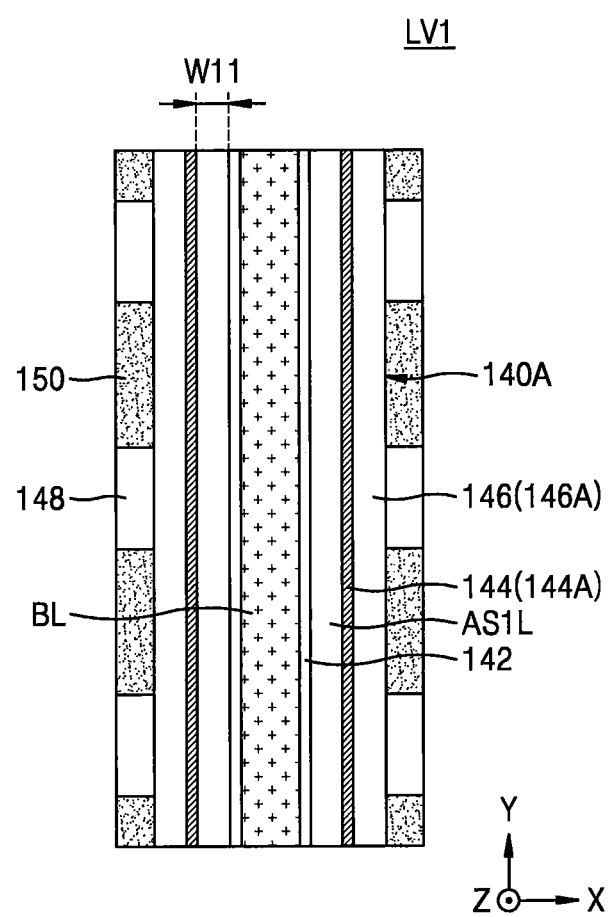
Figure 2C:
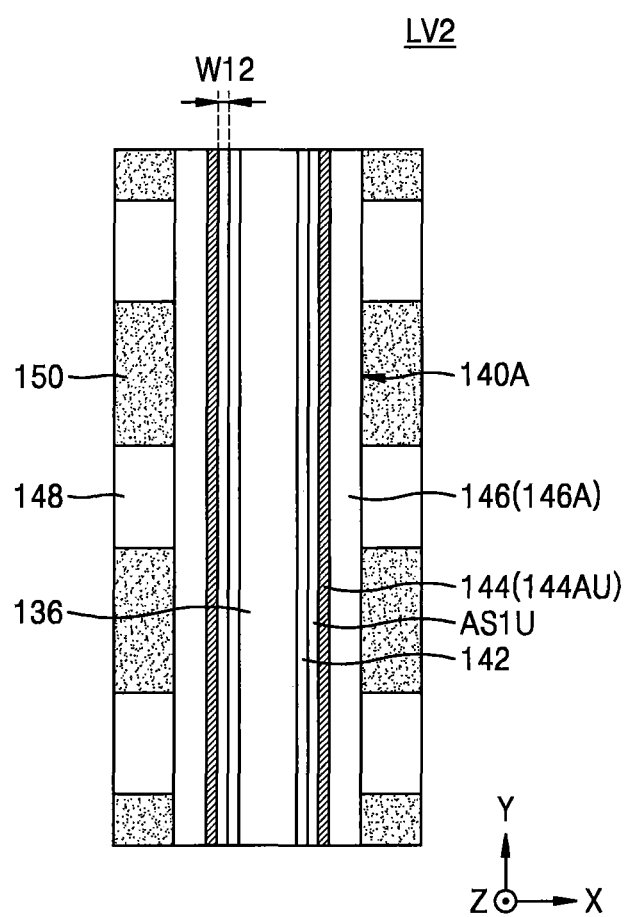
Figure 2D:
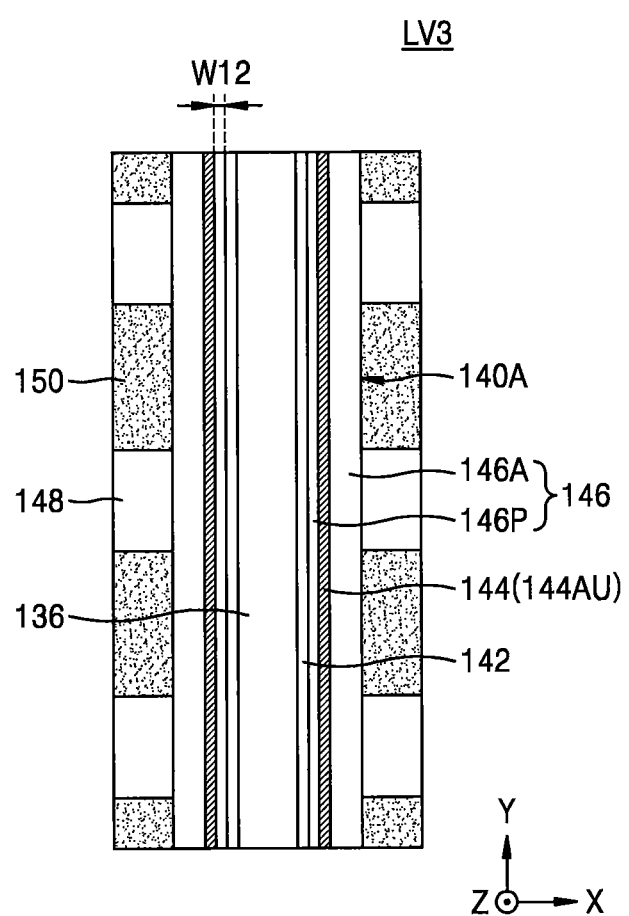
Figure 2E:
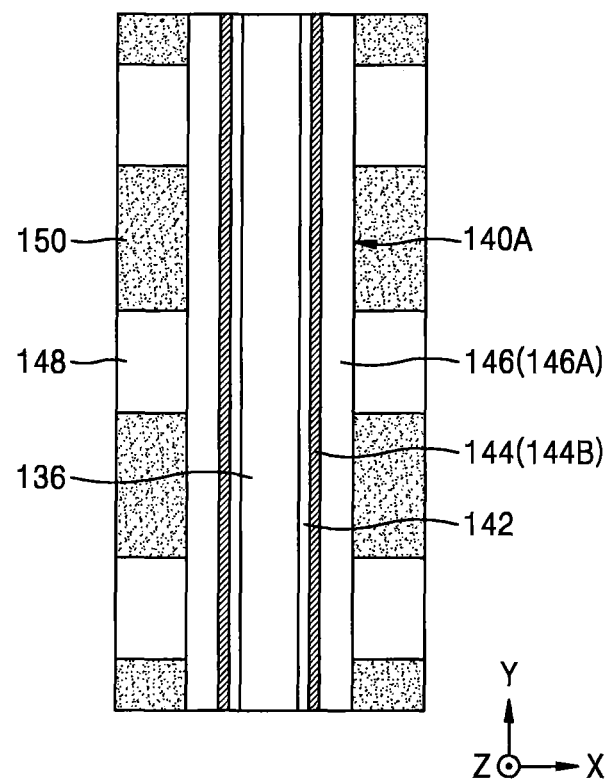

FIG. 2A is a cross-sectional view illustrating a portion of an integrated circuit device 100A according to embodiments of the inventive concepts, FIG. 2B is a plan view of a partial region at a first level LV1 of FIG. 2A, FIG. 2C is a plan view of a partial region at a second level LV2 of FIG. 2A, FIG. 2D is a plan view of a partial region at a third level LV3 of FIG. 2A, and FIG. 2E is a plan view of a partial region at a fourth level LV4 of FIG. 2A. The integrated circuit device 100A shown in FIGS. 2A to 2E may constitute a portion of the integrated circuit device 10 shown in FIG. 1.

Referring to FIGS. 2A to 2E, the integrated circuit device 100A includes a conductive line structure 130A including a bit line BL, which extends over a substrate 110 along a first horizontal direction (Y direction), and an insulating capping pattern 136 covering the bit line BL.

In some embodiments, the substrate 110 may include silicon, for example, single-crystalline silicon, polycrystalline silicon, or amorphous silicon. In some other embodiments, the substrate 110 may include, for example, at least one selected from among Ge, SiGe, SiC, GaAs, InAs, and InP. The substrate 110 may include a conductive region, for example, an impurity-doped well and/or an impurity-doped structure.

An insulating film 120 may be formed on the substrate 110. The insulating film 120 may include, for example, a silicon oxide film, a silicon nitride film, or combinations thereof.

The conductive line structure 130A may extend, on the insulating film 120, in the Y direction. The bit line BL may include, for example, conductive polysilicon, TiN, TiSiN, W, tungsten silicide, or combinations thereof, though the inventive concepts are not limited thereto. In some embodiments, the bit line BL may be composed of multiple layers. The insulating capping pattern 136 may include, for example, a silicon nitride film, though the inventive concepts are not limited thereto.

A plurality of contact structures 150 and insulating fences 148 may be arranged in a line on both sides of the conductive line structure 130A, along the Y direction. Each insulating fence 148 may be arranged between the plurality of contact structures 150 (e.g., in the Y direction) on both sides of the conductive line structure 130A. Each of the plurality of contact structures 150 may penetrate the insulating film 120 and extend to a lower level than a top surface 110T of the substrate 110. Each of the plurality of contact structures 150 may include, for example, doped polysilicon, a metal, a conductive metal nitride, a metal silicide, or combinations thereof, though the inventive concepts are not limited thereto. Each insulating fence 148 may include, for example, a silicon nitride film, though the inventive concepts are not limited thereto.

An insulating spacer 140A may be on and, in some embodiments, cover both sidewalls of the conductive line structure 130A. The bit line BL may be insulated from the plurality of contact structures 150 by the insulating spacer 140A. The insulating spacer 140A may extend long in the Y direction, side by side with the bit line BL, over the substrate 110.

The insulating spacer 140A may include: an inner spacer 142 contacting a sidewall of the conductive line structure 130A; a first insulating spacer 144 on the inner spacer 142, the first insulating spacer 144 on and, in some embodiments, covering the sidewall of the conductive line structure 130A; and a second insulating spacer 146 on and, in some embodiments, covering the sidewall of the conductive line structure 130A, with portions of the first insulating spacer 144 being between the conductive line structure 130A and portions of the second insulating spacer 146.

The inner spacer 142 may extend to conformally be on and, in some embodiments, cover the sidewall of the conductive line structure 130A and a top surface of the insulating film 120. In some embodiments, the inner spacer 142 may include, for example, a silicon nitride film, though the inventive concepts are not limited thereto.

The first insulating spacer 144 may include: a slit portion 144S extending in the Y direction, at a higher level than the top surface 110T of the substrate 110; an insulating pocket unit 144A (also referred to herein as a lower insulating portion 144A) extending in the Y direction, between the substrate 110 and the slit portion 144S; and an upper insulating unit 144B (also referred to herein as an upper insulating portion 144B) spaced apart from the lower insulating portion 144A, with the slit portion 144S therebetween and contacting the inner spacer 142. In some embodiments, each of the lower insulating portion 144A and the upper insulating portion 144B constituting the first insulating spacer 144 may include, for example, a silicon oxide film, though the inventive concepts are not limited thereto. In some embodiments, the slit portion 144S may constitute a gap in the first insulating spacer 144 between the lower insulating portion 144A and the upper insulating portion 144B.

The lower insulating portion 144A may extend side by side with the bit line BL while facing (e.g., being adjacent) the bit line BL. The upper insulating portion 144B may extend side by side with the insulating capping pattern 136 while facing (e.g., being adjacent) the insulating capping pattern 136.

The lower insulating portion 144A may be spaced apart from the inner spacer 142. As a distance from the substrate 110, that is, a distance from the substrate 110 in a Z direction increases, the lower insulating portion 144A may have a portion having a decreasing separation distance between the lower insulating portion 144A and the inner spacer 142, in a second horizontal direction (e.g., an X direction).

An uppermost portion of the lower insulating portion 144A, which defines the slit portion 144S, may be spaced apart from the inner spacer 142, and a bottom portion of the upper insulating portion 144B, which defines the slit portion 144S, may contact the inner spacer 142. In some embodiments, an upper portion 144AU of the lower insulating portion 144A, which is adjacent to the slit portion 144S, may extend substantially in a vertical direction (e.g., a Z direction) with respect to the top surface 110T of the substrate 110. The upper portion 144AU of the lower insulating portion 144A and the inner spacer 142 may extend parallel to each other.

The lower insulating portion 144A may define a first insulating space (also referred to as a first insulating region) having a first width W11 in a horizontal direction (e.g., an X direction) (see FIG. 2B) between the lower insulating portion 144A and the inner spacer 142, at a level facing (e.g., adjacent) the bit line BL, for example, at the first level LV1, and may define a second insulating space (also referred to as a second insulating region) having a second width W12 in a horizontal direction (e.g., an X direction) (see FIGS. 2C and 2D) between the lower insulating portion 144A and the inner spacer 142, at a level facing (e.g., adjacent) the insulating capping pattern 136, for example, at the second level LV2 and the third level LV3, the second width W12 being less than the first width W11. The first insulating region may communicate with the second insulating region. In some embodiments, the first insulating region may physically connect to the second insulating region.

The insulating spacer 140A may further include an air spacer AS1 within the first insulating region and the second insulating region. The air spacer AS1 may include a lower air spacer AS1L within and, in some embodiments, filling the first insulating region, and an upper air spacer AS1U within portions of the second insulating region. In the X direction, a width of the upper air spacer AS1U may be less than a width of the lower air spacer AS1L. In some embodiments, in the X direction, the lower air spacer AS1L may have the first width W11, and the upper air spacer AS1U may have the second width W12. In some embodiments, the air spacer AS1 may constitute a void in the device and may be filled with air, one or more gases, or a vacuum.

The inner spacer 142, the first insulating spacer 144, and the air spacer AS1 may be arranged between the conductive line structure 130A and portions of the second insulating spacer 146. The second insulating spacer 146 may include an outer insulating portion 146A covering an outer sidewall of the first insulating spacer 144, and an insertion portion 146P integrally connected to the outer insulating portion 146A and penetrating the slit portion 144S to extend to a space between the inner spacer 142 and the first insulating spacer 144. The insertion portion 146P may be located in the second insulating region between the upper portion 144AU of the lower insulating portion 144A and the inner spacer 142. The insertion portion 146P may face the insulating capping pattern 136 with the inner spacer 142 therebetween. In some embodiments, the insertion portion 146P may have the second width W12. As shown in FIG. 2D, the insertion portion 146P may extend in the Y direction (e.g., having a line shape). Each of the outer insulating portion 146A and the insertion portion 146P constituting the second insulating spacer 146 may include, for example, a silicon nitride film, an SiOCN film, an SiCN film, or combinations thereof, though the inventive concepts are not limited thereto. SiOCN refers to a material containing silicon (Si), oxygen (O), carbon (C), and nitrogen (N). SiCN refers to a material containing silicon (Si), carbon (C), and nitrogen (N).

Figure 3:
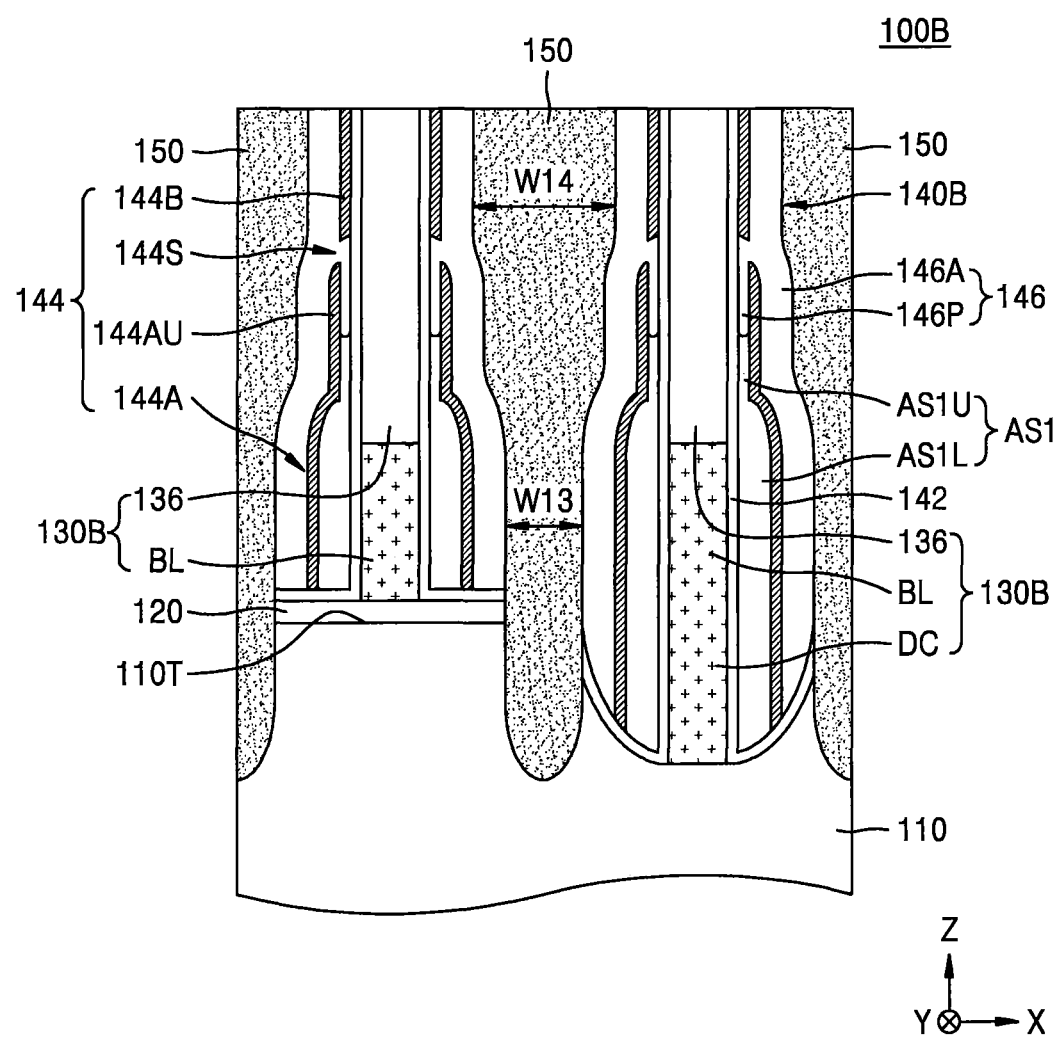
FIG. 3 is a cross-sectional view illustrating a portion of an integrated circuit device according to embodiments of the inventive concepts.

FIG. 3 is a cross-sectional view illustrating a portion of an integrated circuit device 100B according to embodiments of the inventive concepts. The integrated circuit device 100B shown in FIG. 3 may constitute a portion of the integrated circuit device 10 shown in FIG. 1. In FIG. 3, the same reference numerals as in FIGS. 2A to 2E respectively denote the same members, and repeated descriptions thereof will be omitted.

The integrated circuit device 100B may include a plurality of conductive line structures 130B, which include a plurality of bit lines BL extending over the substrate 110 along the first horizontal direction (e.g., the Y direction in FIG. 3) and a plurality of insulating capping patterns 136 respectively covering the plurality of bit lines BL. Each of the plurality of conductive line structures 130B has a substantially identical configuration to the conductive line structure 130A described with reference to FIGS. 2A to 2E. However, each of the plurality of conductive line structures 130B may further include a direct contact DC connected between the bit line BL and an active region of the substrate 110, in addition to the bit line BL and the insulating capping pattern 136. In some embodiments, the bit line BL and the direct contact DC may have an integrally connected structure. In some embodiments, the direct contact DC connected between the bit line BL and the active region of the substrate 110 may be disposed at different locations in different bit lines BL of the plurality of bit lines BL. Thus, as illustrated in FIG. 3, at a particular location, one bit line BL of the plurality of bit lines BL may have the direct contact DC connected between the bit line BL and the active region while an adjacent bit line BL of the plurality of bit lines may not have the direct contact DC at that same location.

The integrated circuit device 100B may include a plurality of insulating spacers 140B covering both sidewalls of each of the plurality of conductive line structures 130B. Each of the plurality of insulating spacers 140B may have a substantially identical configuration to the insulating spacer 140A described with reference to FIGS. 2A to 2E. However, portions of the plurality of insulating spacers 140B, which are on the direct contact DC of each conductive line structure 130B, may have a structure extending (e.g., in a negative Z direction) toward to a lower level of the substrate 110 than the top surface 110T (e.g., uppermost surface) of the substrate 110. Thus, each of the inner spacer 142, the first insulating spacer 144, the lower air spacer AS1L, and the second insulating spacer 146, on both sides of the direct contact DC, may have a structure extending toward a lower level of the substrate 110 than the top surface 110T of the substrate 110, the lower air spacer AS1L being between the lower insulating portion 144A of the first insulating spacer 144 and the inner spacer 142. In some embodiments, the insulating film 120 may be absent from between the inner spacer 142 and the substrate 110 where the direct contact DC extends below the top surface 110T of the substrate 110. In some embodiments, the inner spacer 142 and/or the direct contact DC may directly contact the substrate 110.

As described with reference to FIGS. 2A to 2E, the plurality of contact structures 150 and insulating fences 148 may be arranged in a line along the Y direction, between two adjacent conductive line structures 130B among the plurality of conductive line structures 130B, and each insulating fence 148 may be arranged between the plurality of contact structures 150 in the Y direction. In each contact structure 150 arranged between the two adjacent conductive line structures 130B, a portion facing (e.g., adjacent) the lower insulating portion 144A of the first insulating spacer 144 may have a third width W13 in the X direction, and a portion facing (e.g., adjacent) the upper insulating portion 144B of the first insulating spacer 144 may have a fourth width W14 in the X direction, the fourth width W14 being greater than the third width W13.

Figure 4:
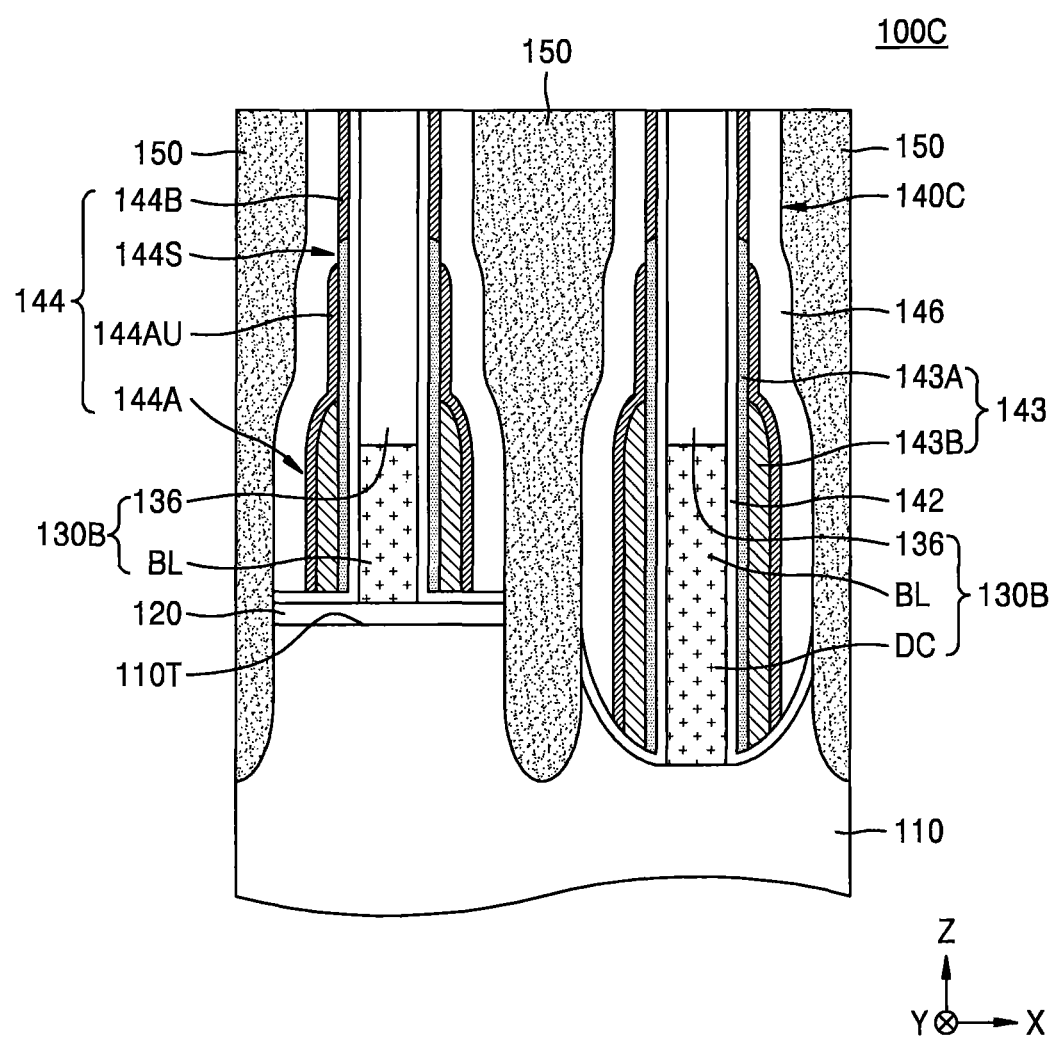
FIG. 4 is a cross-sectional view illustrating a portion of an integrated circuit device according to embodiments of the inventive concepts.

FIG. 4 is a cross-sectional view illustrating a main portion of an integrated circuit device 100C according to embodiments of the inventive concepts. The integrated circuit device 100C shown in FIG. 4 may constitute a portion of the integrated circuit device 10 shown in FIG. 1. In FIG. 4, the same reference numerals as in FIGS. 2A to 3 respectively denote the same members, and repeated descriptions thereof will be omitted.

The integrated circuit device 100C may have a substantially identical configuration to the integrated circuit device 100B described with reference to FIG. 3. However, the integrated circuit device 100C may include a plurality of insulating spacers 140C covering both sidewalls of each of the plurality of conductive line structures 130B. Each of the plurality of insulating spacers 140C may have a substantially identical configuration to each insulating spacer 140B described with reference to FIG. 3. However, each of the plurality of insulating spacers 140C may include a polymer spacer 143 within and, in some embodiments, filling the first insulating region and the second insulating region, which are defined between the inner spacer 142 and the lower insulating portion 144A. In some embodiments, each of the plurality of insulating spacers 140C may not include the air spacer AS1 shown in FIGS. 2A to 3. Though the polymer spacer 143 is described within the first and second insulating regions without the air spacer AS1, it will be understood that some number of minimal void spaces may be present in the polymer spacer 143 without deviating from the inventive concepts described herein.

In some embodiments, the polymer spacer 143 may have a lower dielectric constant than a silicon oxide film. For example, the polymer spacer 143 may have a dielectric constant of about 2 to about 3. In some embodiments, the polymer spacer 143 may include a graft polymer layer 143A in the first insulating region and the second insulating region and a vertical domain layer 143B in the first insulating region, the graft polymer layer 143A being chemically bonded to the inner spacer 142, and the vertical domain layer 143B including a polymer block self-assembled onto the graft polymer layer 143A. Each of the graft polymer layer 143A and the vertical domain layer 143B constituting the polymer spacer 143 may include a portion on a sidewall of the direct contact DC, and the portion may have a structure extending toward the inside of the substrate 110 to a lower level than the top surface 110T of the substrate 110. In some embodiments, unlike the integrated circuit device 100B, the integrated circuit device 100C may not include an insertion portion 146P of the second insulating spacer 146, as the graft polymer layer 143A of the integrated circuit device 100C may be within a portion of the second insulating region that, in the integrated circuit device 100B, would be occupied by the insertion portion 146P.

Each of the graft polymer layer 143A and the vertical domain layer 143B may include a vinyl polymer, though the inventive concepts are not limited thereto. For example, each of the graft polymer layer 143A and the vertical domain layer 143B may include, for example, an aromatic hydrocarbon polymer, a (meth)acrylic polymer, a vinylpyridine polymer, a vinylester polymer, a vinylpyrrolidone polymer, an olefin polymer, or combinations thereof. In some embodiments, each of the graft polymer layer 143A and the vertical domain layer 143B may include, for example, polystyrene (PS). In some embodiments, each of the graft polymer layer 143A and the vertical domain layer 143B may include, for example, poly(methyl methacrylate) (PMMA). However, these are merely examples, and the inventive concepts are not limited to the examples set forth above.

Figure 5:
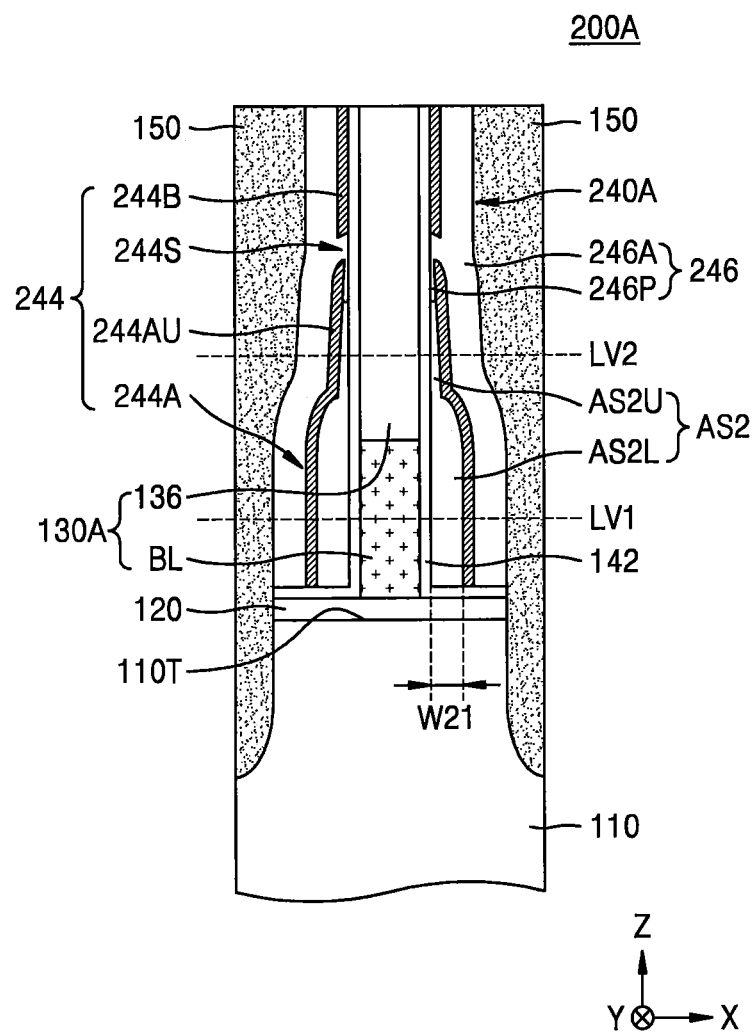
FIG. 5 is a cross-sectional view illustrating a portion of an integrated circuit device according to embodiments of the inventive concepts.

FIG. 5 is a cross-sectional view illustrating a portion of an integrated circuit device 200A according to embodiments of the inventive concepts. The integrated circuit device 200A shown in FIG. 5 may constitute a portion of the integrated circuit device 10 shown in FIG. 1. In FIG. 5, the same reference numerals as in FIGS. 2A to 2E respectively denote the same members, and repeated descriptions thereof will be omitted.

The integrated circuit device 200A may have a substantially identical configuration to the integrated circuit device 100A described with reference to FIGS. 2A to 2E. However, in the integrated circuit device 200A, an insulating spacer 240A may be on both sidewalls of the conductive line structure 130A. The insulating spacer 240A may include the inner spacer 142, a first insulating spacer 244, and a second insulating spacer 246.

The first insulating spacer 244 may include a slit portion 244S, a lower insulating portion 244A, and an upper insulating portion 244B. The slit portion 244S, the lower insulating portion 244A, and the upper insulating portion 244B respectively have similar configurations to the slit portion 144S, the lower insulating portion 144A, and the upper insulating portion 144B shown in FIG. 2A. However, an upper portion 244AU of the lower insulating portion 244A adjacent to an uppermost portion thereof defining the slit portion 244S may extend in an inclined direction to be gradually closer to the inner spacer 142 with increasing distance from the substrate 110.

The insulating spacer 240A may further include an air spacer AS2 filling insulating regions defined between the inner spacer 142 and the lower insulating portion 244A. The air spacer AS2 may include a lower air spacer AS2L having a first width W21 (e.g., in the X direction) between the lower insulating portion 244A and the inner spacer 142 at the first level LV1, and an upper air spacer AS2U having a width, which is less than the first width W21, between the upper portion 244AU of the lower insulating portion 244A and the inner spacer 142 at the second level LV2, the upper portion 244AU being adjacent to the slit portion 244S. The lower air spacer AS2L may communicate with the upper air spacer AS2U. In some embodiments, the lower air spacer AS2L may physically connect to the upper air spacer AS2U. In the X direction, the width of the upper air spacer AS2U may gradually decrease with increasing distance from the substrate 110.

The second insulating spacer 246 may include an outer insulating portion 246A on, and, in some embodiments, covering an outer sidewall of the first insulating spacer 244, and an insertion portion 246P integrally connected to the outer insulating portion 246A and penetrating the slit portion 244S to extend to a space between the inner spacer 142 and the first insulating spacer 244. A vertical length of the insertion portion 246P (e.g., in the Z direction) may be less than a vertical length of the insertion portion 146P shown in FIG. 2A.

Figure 6:
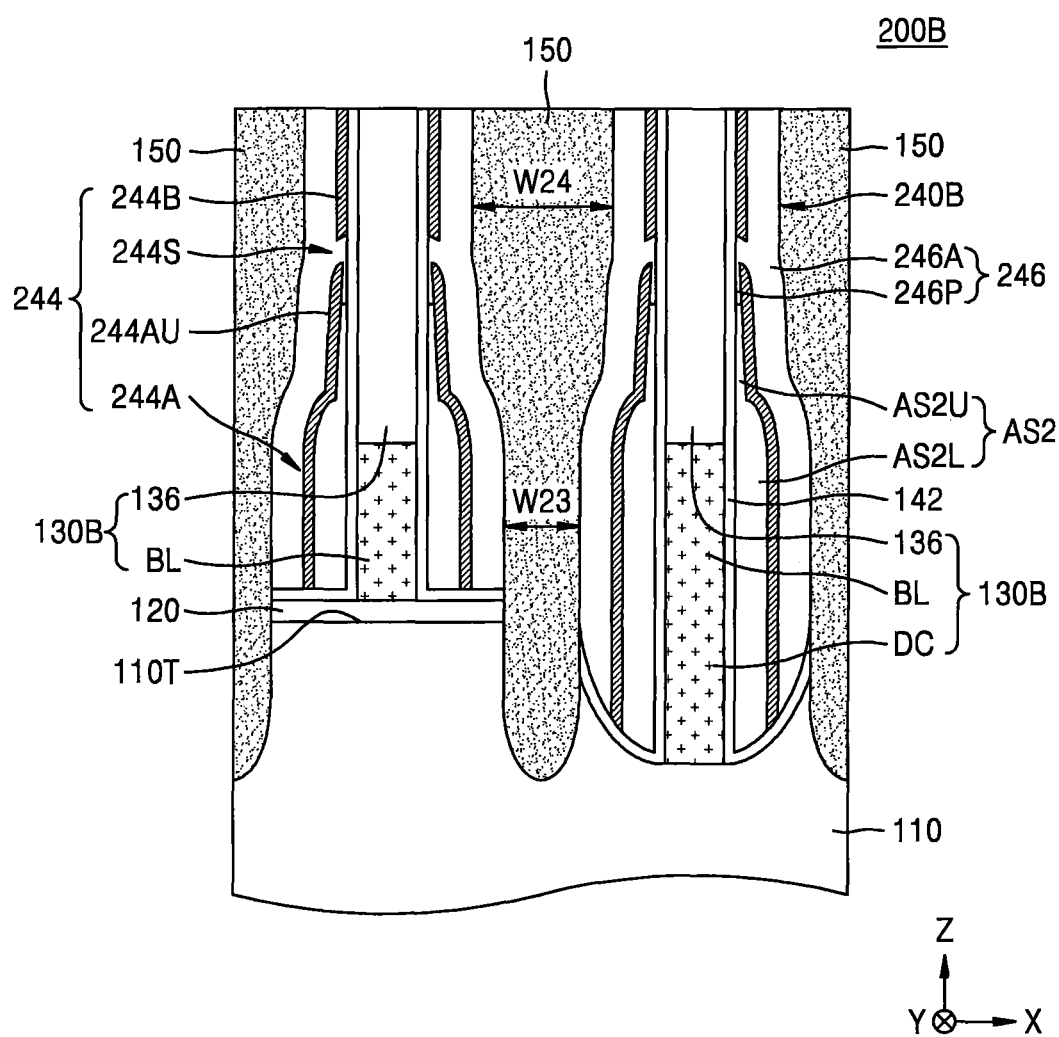
FIG. 6 is a cross-sectional view illustrating a portion of an integrated circuit device according to embodiments of the inventive concepts.

FIG. 6 is a cross-sectional view illustrating a portion of an integrated circuit device 200B according to embodiments of the inventive concepts. The integrated circuit device 200B shown in FIG. 6 may constitute a portion of the integrated circuit device 10 shown in FIG. 1. In FIG. 6, the same reference numerals as in FIGS. 2A to 5 respectively denote the same members, and repeated descriptions thereof will be omitted.

The integrated circuit device 200B, similarly to the integrated circuit device 100B shown in FIG. 3, may include the plurality of conductive line structures 130A and 130B extending, over the substrate 110, along the first horizontal direction (Y direction in FIG. 3). The integrated circuit device 200B may include a plurality of insulating spacers 240B covering both sidewalls of each of the plurality of conductive line structures 130B. Each of the plurality of insulating spacers 240B may have a substantially identical configuration to the insulating spacer 240A described with reference to FIG. 5. However, portions of the plurality of insulating spacers 240B, which cover the direct contact DC of each conductive line structure 130B, may have a structure extending toward the inside of the substrate 110 to a lower level than the top surface 110T of the substrate 110.

Similarly to the example shown in FIGS. 2B to 2E, the plurality of contact structures 150 and a plurality of insulating fences 148 may be alternately arranged one by one along the Y direction, between two adjacent conductive line structures 130B among the plurality of conductive line structures 130B. In each contact structure 150 arranged between the two adjacent conductive line structures 130B, a portion facing (e.g., adjacent) the lower insulating portion 244A of the first insulating spacer 244 may have a third width W23 in the X direction, and a portion facing (e.g., adjacent) the upper insulating portion 244B of the first insulating spacer 244 may have a fourth width W24 in the X direction, the fourth width W24 being greater than the third width W23.

In some embodiments, the integrated circuit device 200B may include, instead of the air spacer AS2, a polymer spacer filling insulating regions defined between the inner spacer 142 and the lower insulating portion 244A. The polymer spacer, which may be used for the insulating spacers 240B, may have an identical or similar configuration to the polymer spacer 143 described with reference to FIG. 4.

Figure 7:
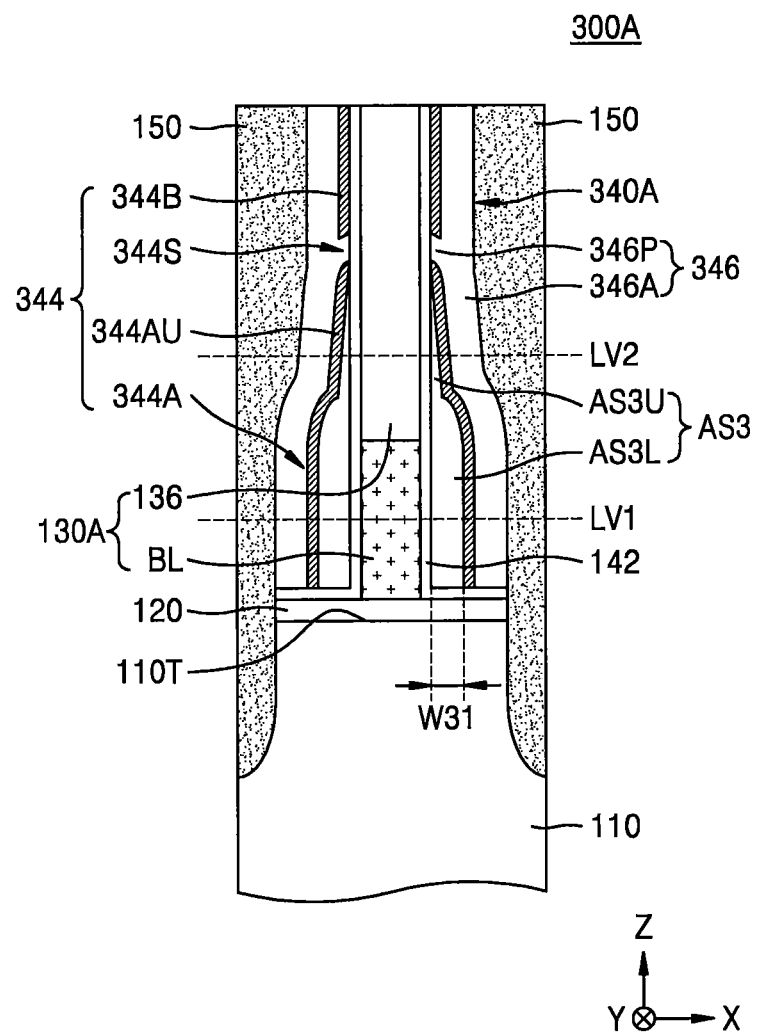
FIG. 7 is a cross-sectional view illustrating a portion of an integrated circuit device according to yet other embodiments of the inventive concepts.

FIG. 7 is a cross-sectional view illustrating a portion of an integrated circuit device 300A according to embodiments of the inventive concepts. The integrated circuit device 300A shown in FIG. 7 may constitute a portion of the integrated circuit device 10 shown in FIG. 1. In FIG. 7, the same reference numerals as in FIGS. 2A to 2E respectively denote the same members, and repeated descriptions thereof will be omitted.

The integrated circuit device 300A may have a substantially identical configuration to the integrated circuit device 100A described with reference to FIGS. 2A to 2E. However, in the integrated circuit device 300A, an insulating spacer 340A may be on, and in some embodiments, cover both sidewalls of the conductive line structure 130A. The insulating spacer 340A may include the inner spacer 142, a first insulating spacer 344, and a second insulating spacer 346.

The first insulating spacer 344 may include a slit portion 344S, a lower insulating portion 344A, and an upper insulating portion 344B. The slit portion 344S, the lower insulating portion 344A, and the upper insulating portion 344B respectively have similar configurations to the slit portion 144S, the lower insulating portion 144A, and the upper insulating portion 144B shown in FIG. 2A. However, an uppermost portion of the lower insulating portion 344A, which defines the slit portion 344S, may contact the inner spacer 142, and an upper portion 344AU of the lower insulating portion 344A, which is adjacent to the slit portion 344S, may extend in an inclined direction to be gradually closer to the inner spacer 142 with increasing distance from the substrate 110.

The insulating spacer 340A may further include an air spacer AS3 filling insulating regions defined between the inner spacer 142 and the lower insulating portion 344A. The air spacer AS3 may include a lower air spacer AS3L filling a first insulating region having a first width W31 between the lower insulating portion 344A and the inner spacer 142 at the first level LV1, and an upper air spacer AS3U filling a second insulating region having a width, which is less than the first width W31, between the upper portion 344AU of the lower insulating portion 344A and the inner spacer 142 at the second level LV2. The lower air spacer AS3L may communicate with the upper air spacer AS3U. In some embodiments, the lower air spacer AS3L may physically connect to the upper air spacer AS3U. In the X direction, the width of the upper air spacer AS3U may gradually decrease with increasing distance from the substrate 110, and an uppermost portion of the upper air spacer AS3U may be determined by a point at which the upper portion 344AU of the lower insulating portion 344A contacts the inner spacer 142.

The second insulating spacer 346 may include an outer insulating portion 346A on and, in some embodiments, covering an outer sidewall of the first insulating spacer 344, and a protruding portion 346P protruding from the outer insulating portion 346A and filling the slit portion 344S.

Figure 8:
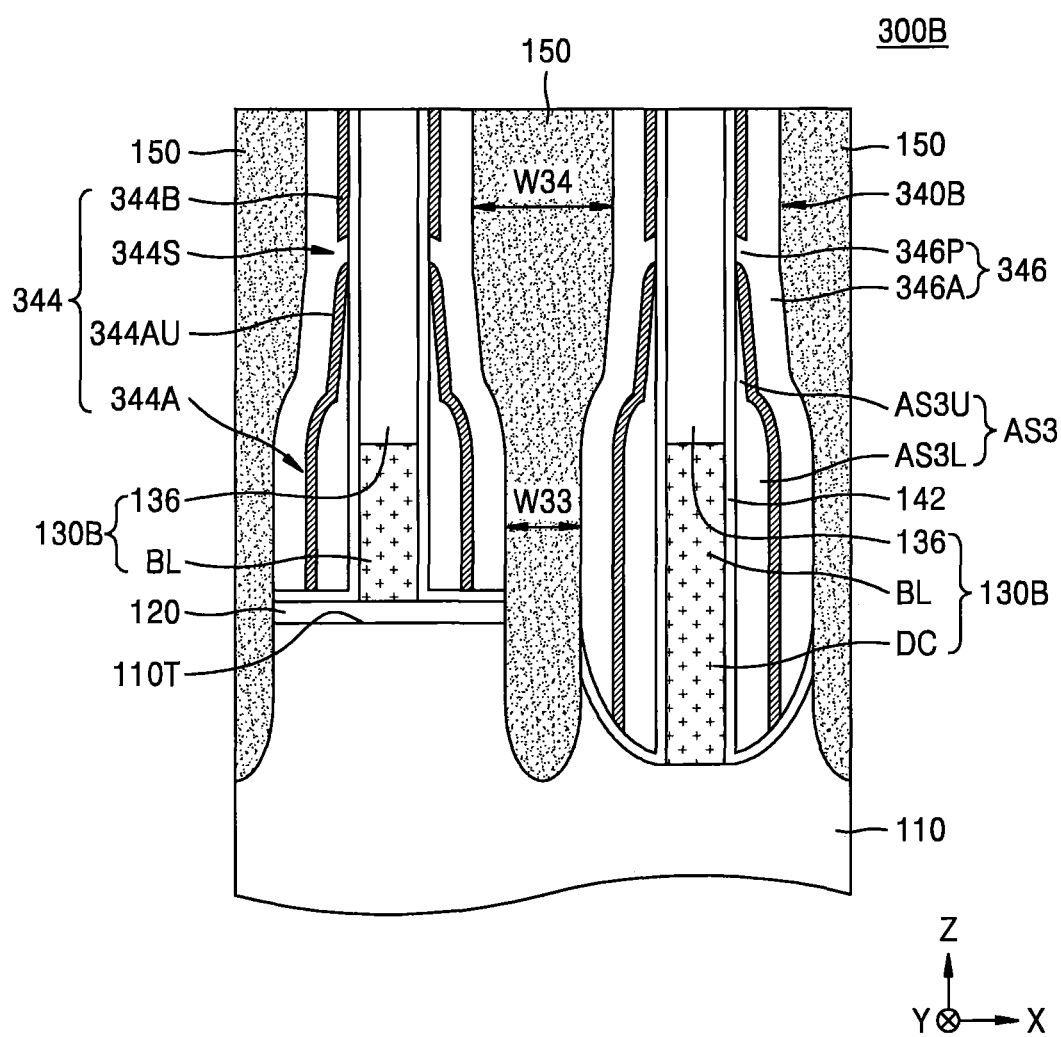
FIG. 8 is a cross-sectional view illustrating a portion of an integrated circuit device according to embodiments of the inventive concepts.

FIG. 8 is a cross-sectional view illustrating a main portion of an integrated circuit device 300B according to embodiments of the inventive concepts. The integrated circuit device 300B shown in FIG. 8 may constitute a portion of the integrated circuit device 10 shown in FIG. 1. In FIG. 8, the same reference numerals as in FIGS. 2A to 7 respectively denote the same members, and repeated descriptions thereof will be omitted.

The integrated circuit device 300B, similarly to the integrated circuit device 100B shown in FIG. 3, may include the plurality of conductive line structures 130B extending, over the substrate 110, along the first horizontal direction (Y direction in FIG. 3). The integrated circuit device 300B may include a plurality of insulating spacers 340B on, and in some embodiments, covering both sidewalls of each of the plurality of conductive line structures 130B. Each of the plurality of insulating spacers 340B may have a substantially identical configuration to the insulating spacer 340A described with reference to FIG. 7. However, portions of the plurality of insulating spacers 340B, which are on the direct contact DC of each conductive line structure 130B, may have a structure extending toward the inside of the substrate 110 to a lower level than the top surface 110T of the substrate 110.

Similarly to the example shown in FIGS. 2B to 2E, the plurality of contact structures 150 and the plurality of insulating fences 148 may be alternately arranged one by one along the Y direction, between two adjacent conductive line structures 130B among the plurality of conductive line structures 130B. In each contact structure 150 arranged between the two adjacent conductive line structures 130B, a portion facing (e.g., adjacent) the lower insulating portion 344A of the first insulating spacer 344 may have a third width W33 in the X direction, and a portion facing (e.g., adjacent) the upper insulating portion 344B of the first insulating spacer 344 may have a fourth width W34 in the X direction, the fourth width W34 being greater than the third width W33.

In some other embodiments, the integrated circuit device 300B may include, instead of the air spacer AS3, a polymer spacer within and, in some embodiments, filling insulating regions defined between the inner spacer 142 and the lower insulating portion 344A. The polymer spacer, which may be used for the insulating spacers 340B, may have an identical or similar configuration to the polymer spacer 143 described with reference to FIG. 4.

Although examples of the configuration of the integrated circuit devices according to embodiments of the inventive concepts have been described with reference to FIGS. 1 to 8, the inventive concepts are not limited thereto. According to the inventive concepts, there may be provided integrated circuit devices having structures variously modified and changed from those described with reference to FIGS. 1 to 8 without departing from the scope of the inventive concepts.

The integrated circuit devices 100A, 100B, 100C, 200A, 200B, 300A, and 300B according to embodiments of the inventive concepts may respectively include the insulating spacers 140A, 140B, 140C, 240A, 240B, 340A, and 340B between the conductive line structure 130A and/or 130B and the plurality of contact structures 150. The insulating spacers 140A, 140B, 140C, 240A, 240B, 340A, and/or 340B including the air spacer AS1, AS2, and/or AS3 and/or the polymer spacer 143 may have an extremely low dielectric constant. Therefore, the integrated circuit devices set forth above may provide structures capable of minimizing load capacitance between a plurality of conductive patterns in a unit cell due to high integration.

FIGS. 9 to 27 are cross-sectional views illustrating a method of fabricating an integrated circuit device 400, according to embodiments of the inventive concepts. In FIGS. 9 to 14, 15A, 16A, . . . , 25A, 26, and 27, each cross-sectional view denoted by (a) illustrates a configuration of a region corresponding to a cross-section taken along a line A-A' of FIG. 1, and each cross-sectional view denoted by (b) illustrates a configuration of a region corresponding to a cross-section taken along a line B-B' of FIG. 1. FIGS. 15B, 16B, . . . , and 25B are respectively enlarged cross-sectional views illustrating partial regions XX in the cross-sectional views denoted by (a) in FIGS. 15A, 16A, . . . , and 25A, respectively. In FIGS. 9 to 27, the same reference numerals as in FIGS. 1 to 8 respectively denote the same members, and repeated descriptions thereof will be omitted.

Figure 9:
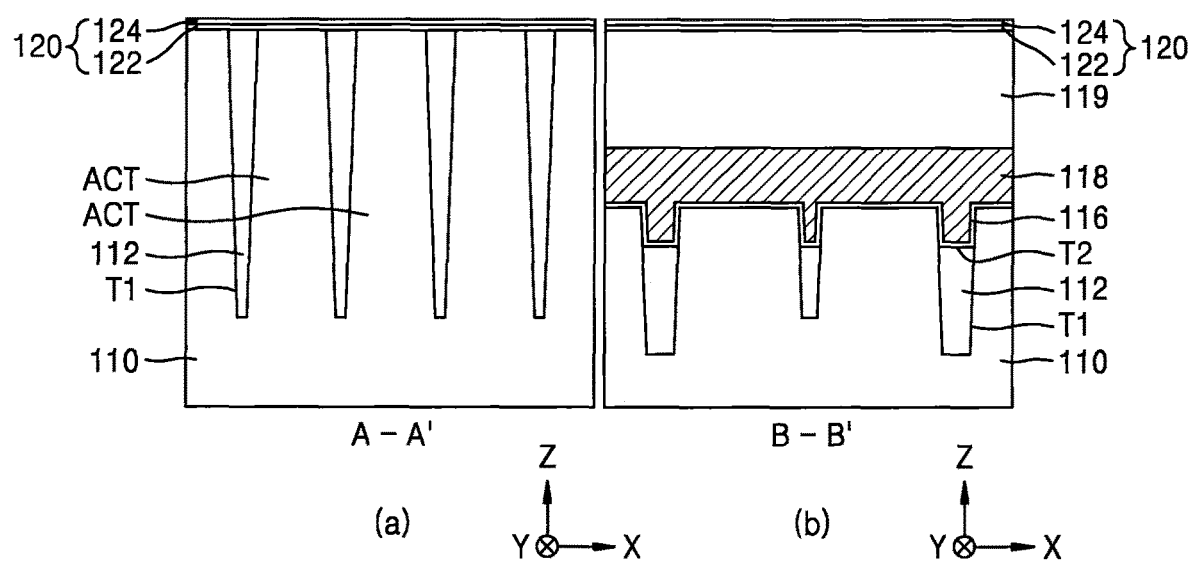
FIGS. 9 to 27 are cross-sectional views illustrating a method of fabricating an integrated circuit device, according to embodiments of the inventive concepts, and in particular, FIGS. 9 to 14, 15A, 16A, . . . , 25A, 26, and 27 each illustrate cross-sectional views of configurations respectively corresponding to cross-sections taken along lines A-A' and B-B' of FIG. 1, and FIGS. 15B, 16B, . . . , and 25B are respectively enlarged cross-sectional views illustrating partial regions of FIGS. 15A, 16A, . . . , and 25A.

Referring to FIG. 9, a device isolation trench T1 may be formed in the substrate 110, and a device isolation film 112 may be formed in the device isolation trench T1.

An active region ACT may be defined in the substrate 110 by the device isolation film 112. The device isolation film 112 may include, for example, an oxide film, a nitride film, or combinations thereof, though the present inventive concepts are not limited thereto. The device isolation film 112 may include a single layer including one insulating film, two layers including two different insulating films, or multiple layers including combinations of at least three insulating films.

A plurality of word line trenches T2 may be formed in the substrate 110. The plurality of word line trenches T2 may extend parallel to each other in the X direction, and may have line shapes crossing the active region ACT. As shown in the cross-sectional view denoted by (b) in FIG. 9, to form the plurality of word line trenches T2 each having a step at a bottom surface thereof, the device isolation film 112 and the substrate 110 may be respectively etched by separate etching processes, and thus have different etch depths. A result product, in which the plurality of word line trenches T2 are formed, may be cleaned, followed by forming a gate dielectric film 116, a word line 118, and a buried insulating film 119 in each of the plurality of word line trenches T2 in this stated order. The word line 118 may constitute a word line WL shown in FIG. 1. In some embodiments, after a plurality of word lines 118 are formed, impurity ions may be implanted into the substrate 110 on both sides of each of the plurality of word lines 118, thereby forming a plurality of source/drain regions in upper portions of the plurality of active regions ACT. In some other embodiments, before the plurality of word lines 118 are formed, an impurity ion implantation process for forming the plurality of source/drain regions may be performed.

The gate dielectric film 116 may include at least one selected, for example, from among a silicon oxide film, a silicon nitride film, a silicon oxynitride film, oxide/nitride/oxide (ONO), and a high-K dielectric film having a higher dielectric constant than a silicon oxide film. For example, the gate dielectric film 116 may have a dielectric constant of about 10 to about 25. In some embodiments, the gate dielectric film 116 may include, for example, $HfO_2$, $Al_2O_3$, $HfAlO_3$, $Ta_2O_5$, $TiO_2$, or combinations thereof, without being limited thereto. Each of the plurality of word lines 118 may include, for example, Ti, TiN, Ta, TaN, W, WN, TiSiN, WSiN, or combinations thereof.

A top surface of each of a plurality of buried insulating films 119 may be at a substantially identical level to the top surface of the substrate 110. Each of the plurality of buried insulating films 119 may include, for example, a silicon oxide film, a silicon nitride film, a silicon oxynitride film, or combinations thereof. The insulating film 120 may be formed on the plurality of buried insulating films 119 and the substrate 110. The insulating film 120 may include a first insulating film 122 and a second insulating film 124, which may be formed on the substrate 110 in this stated order. The insulating film 120 may be on and/or cover top surfaces of the plurality of active regions ACT, a top surface of the device isolation film 112, and top surfaces of the plurality of buried insulating films 119. In some embodiments, the first insulating film 122 may include, for example, a silicon oxide film, and the second insulating film 124 may include, for example, a silicon nitride film, though the inventive concepts are not limited thereto.

Figure 10:
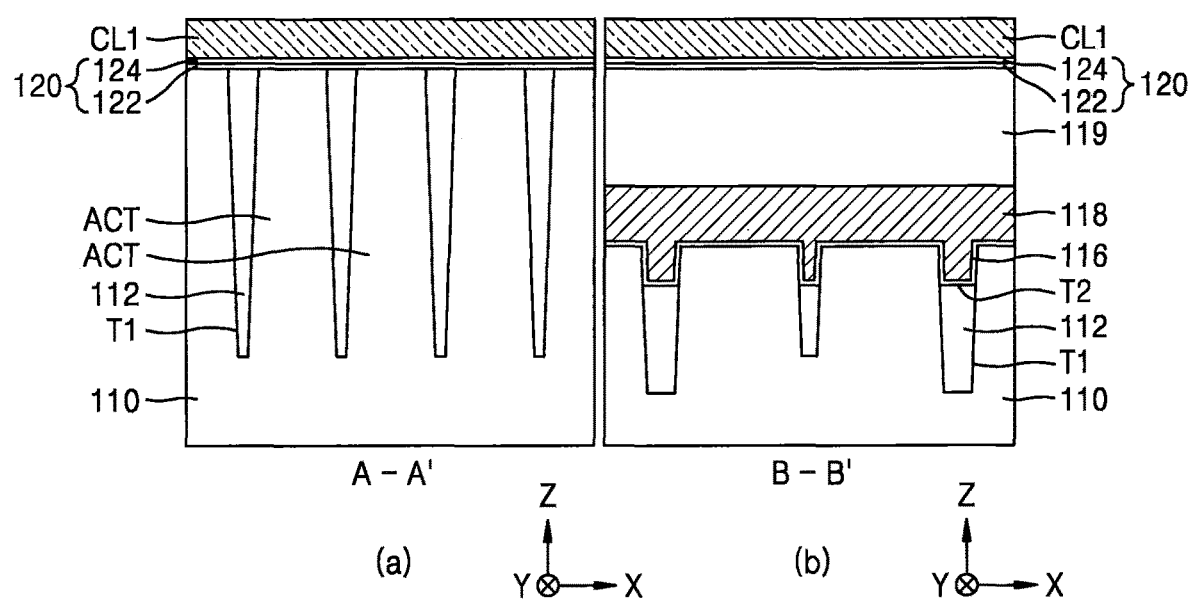

Referring to FIG. 10, a first conductive layer CL1 may be formed on the insulating film 120. The first conductive layer CL1 may include, but is not limited to, doped polysilicon.

Figure 11:
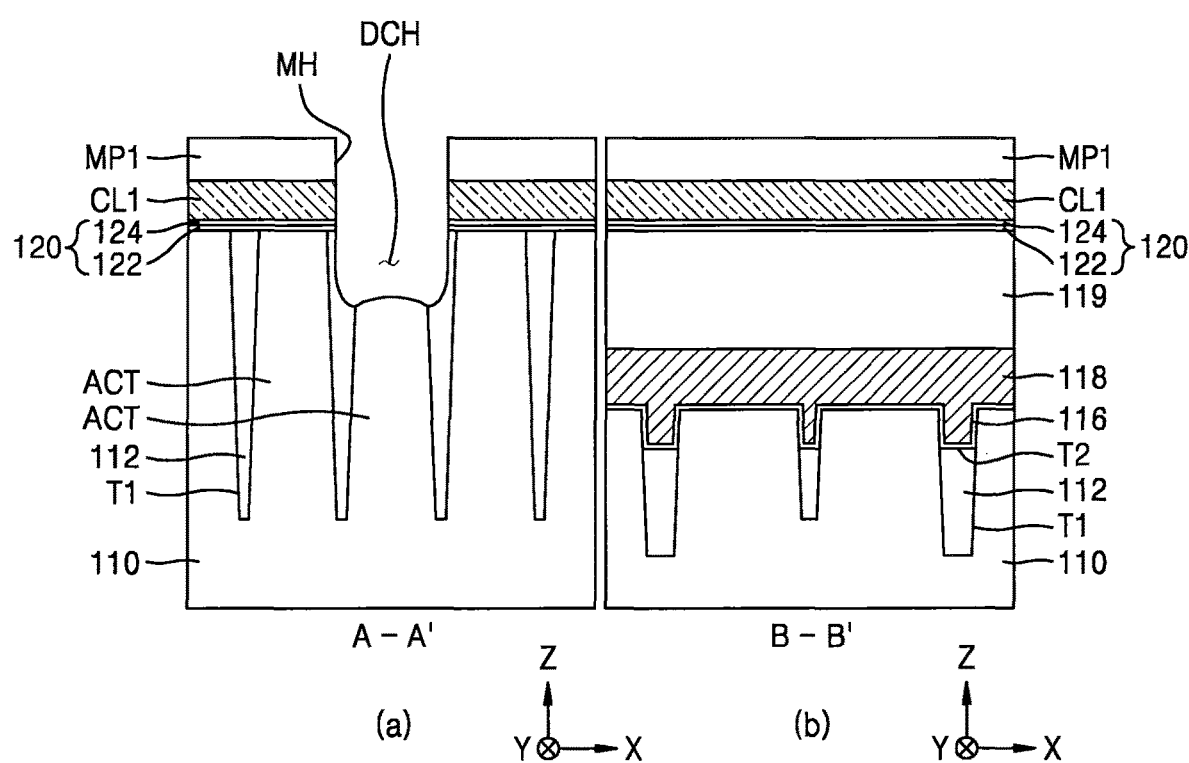

Referring to FIG. 11, a mask pattern MP1 may be formed on the first conductive layer CL1, followed by etching the first conductive layer CL1 exposed by an opening MH of the mask pattern MP1, and then, a portion of the substrate 110 and a portion of the device isolation film 112, which are exposed as a result, may be etched, thereby forming a direct contact hole DCH exposing the active region ACT of the substrate 110.

The mask pattern MP1 may include, for example, an oxide film, a nitride film, or combinations thereof. A photolithography process may be used to form the mask pattern MP1.

Figure 12:
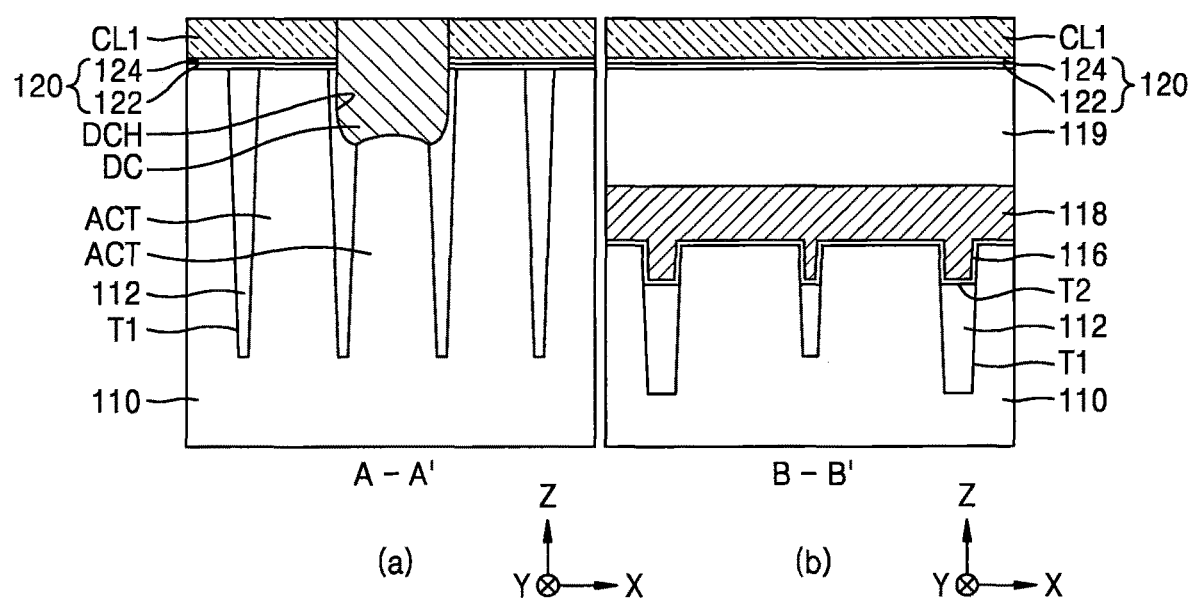

Referring to FIG. 12, the mask pattern MP1 (see FIG. 11) may be removed, followed by forming a direct contact DC in the direct contact hole DCH.

In an example of a process of forming the direct contact DC, a second conductive layer, which has a sufficient thickness to substantially fill the direct contact hole DCH, may be formed in the direct contact hole DCH and on the first conductive layer CL1, followed by performing an etch-back of the second conductive layer so that the second conductive layer remains primarily in the direct contact hole DCH. The second conductive layer may include, for example, doped polysilicon, without being limited thereto.

Figure 13:
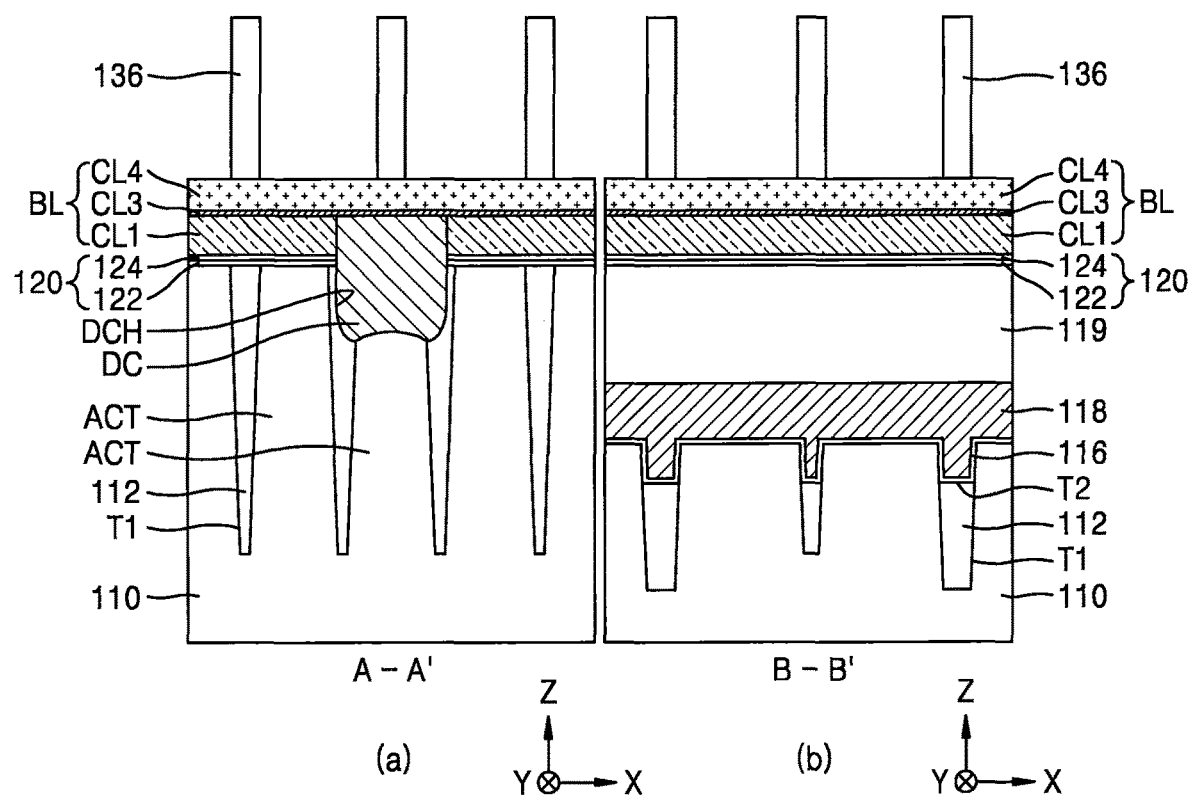

Referring to FIG. 13, a third conductive layer CL3, a fourth conductive layer CL4, and the plurality of insulating capping patterns 136 may be formed on the first conductive layer CL1 and the direct contact DC.

Each of the plurality of insulating capping patterns 136 may include a line pattern extending in the Y direction. Each of the third conductive layer CL3 and the fourth conductive layer CL4 may include, for example, TiN, TiSiN, W, tungsten silicide, or combinations thereof. In some embodiments, the third conductive layer CL3 may include, for example, TiSiN, and the fourth conductive layer CL4 may include, for example, W. Each of the plurality of insulating capping patterns 136 may include, for example, a silicon nitride film.

Figure 14:
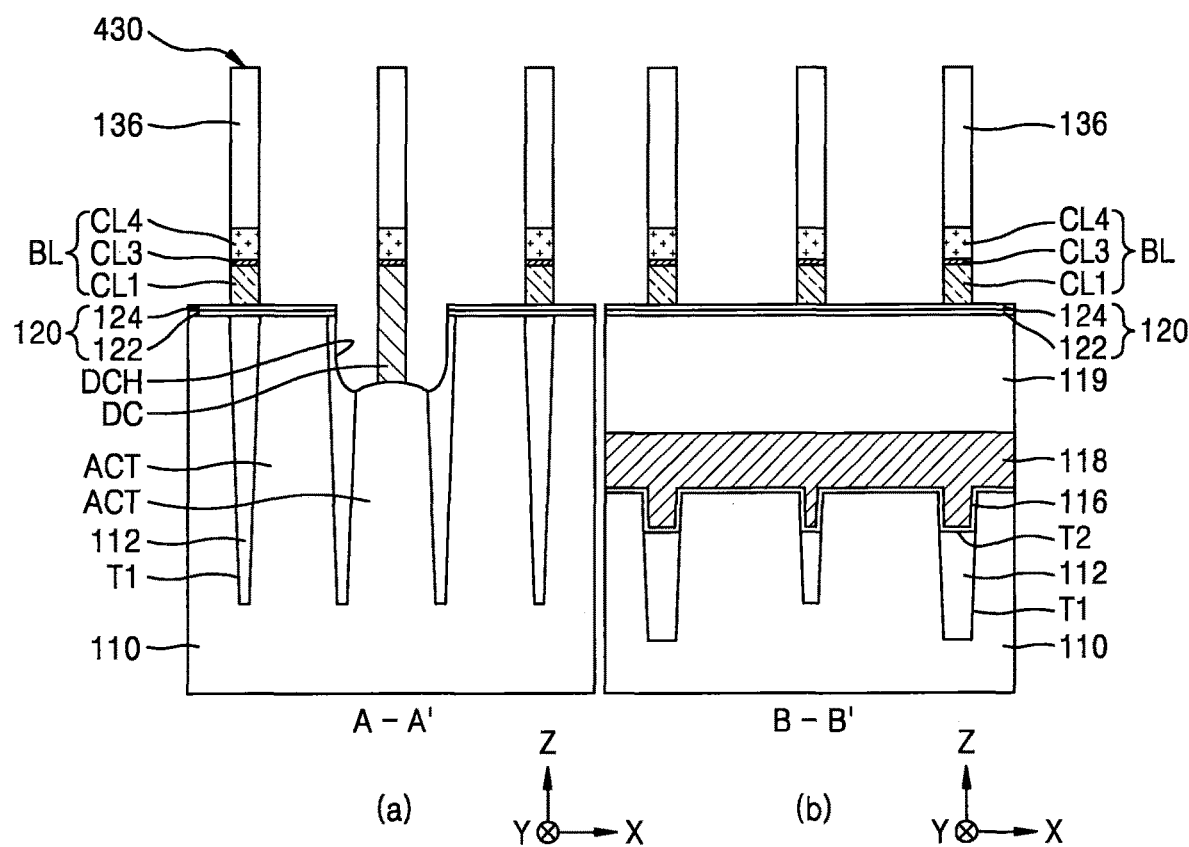

Referring to FIG. 14, each of the fourth conductive layer CL4, the third conductive layer CL3, the first conductive layer CL1, and the direct contact DC under the insulating capping patterns 136 may be partially etched by using the insulating capping patterns 136 as an etch mask, thereby forming the plurality of bit lines BL over the substrate 110. Thus, a plurality of conductive line structures 430 each including the bit line BL and the insulating capping pattern 136 may be formed. In some embodiments, each of the plurality of conductive line structures 430 may include the direct contact DC integrally connected to the bit line BL.

Each of the plurality of bit lines BL may include remaining portions of the first conductive layer CL1, the third conductive layer CL3, and the fourth conductive layer CL4. After the plurality of bit lines BL are formed, the direct contact hole DCH may be partially exposed again around the direct contact DC.

Figure 15A:
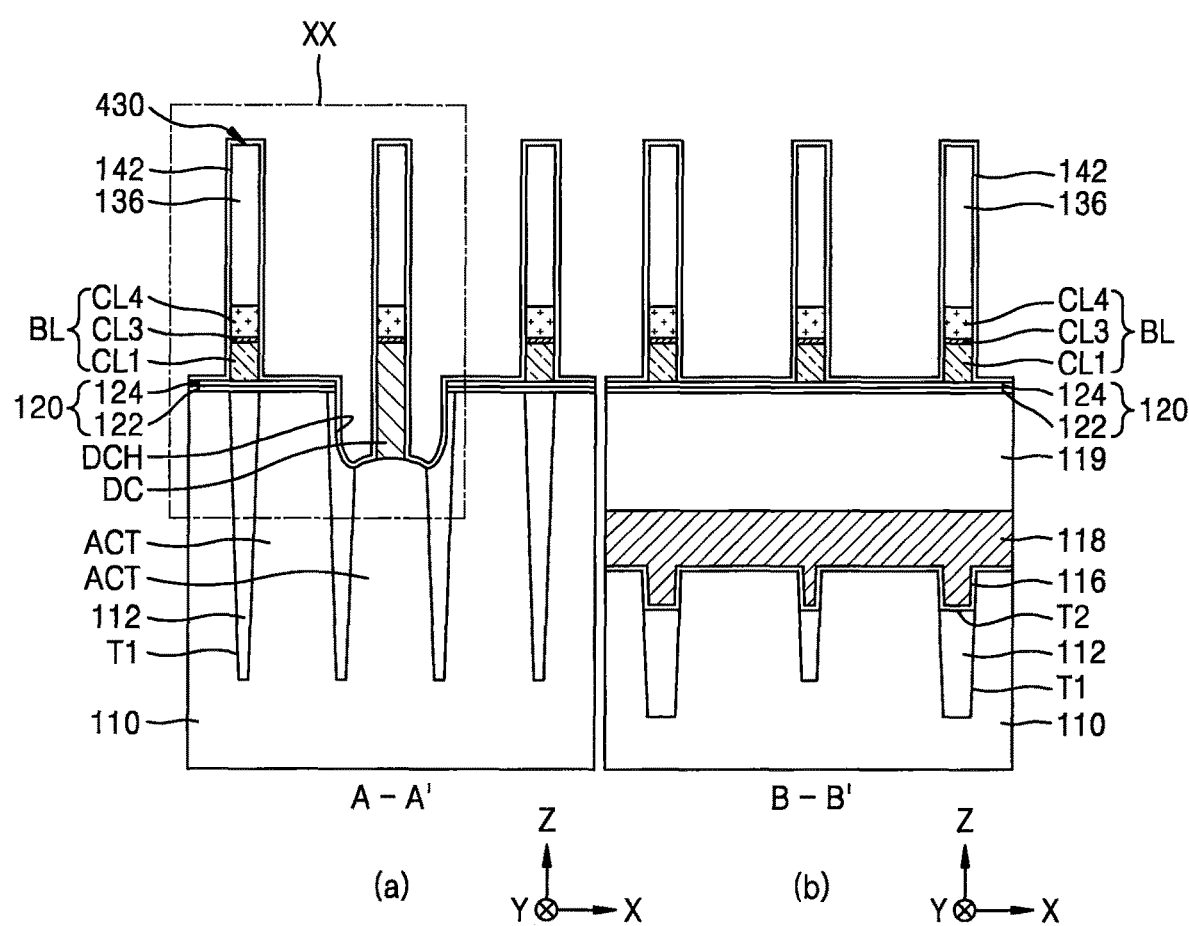
Figure 15B:
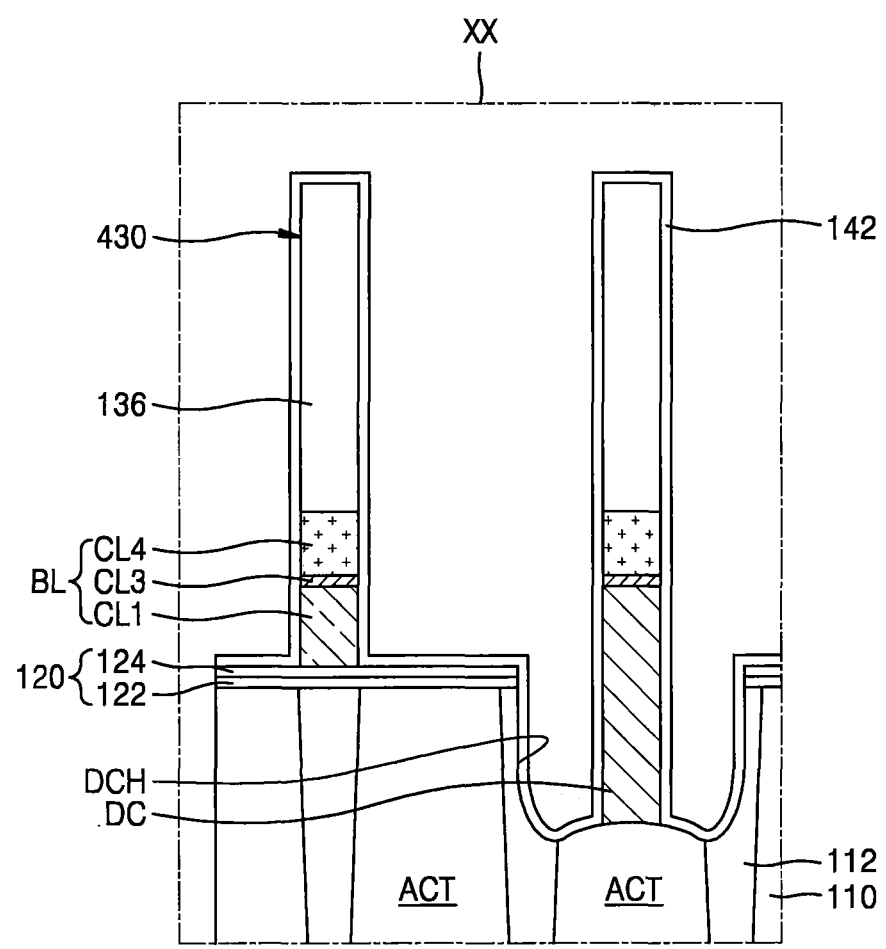

Referring to FIGS. 15A and 15B, the inner spacer 142 may be formed, the inner spacer 142 conformally covering exposed surfaces of a result product of FIG. 14.

In some embodiments, an atomic layer deposition (ALD) or chemical vapor deposition (CVD) process may be used to form the inner spacer 142.

Figure 16A:
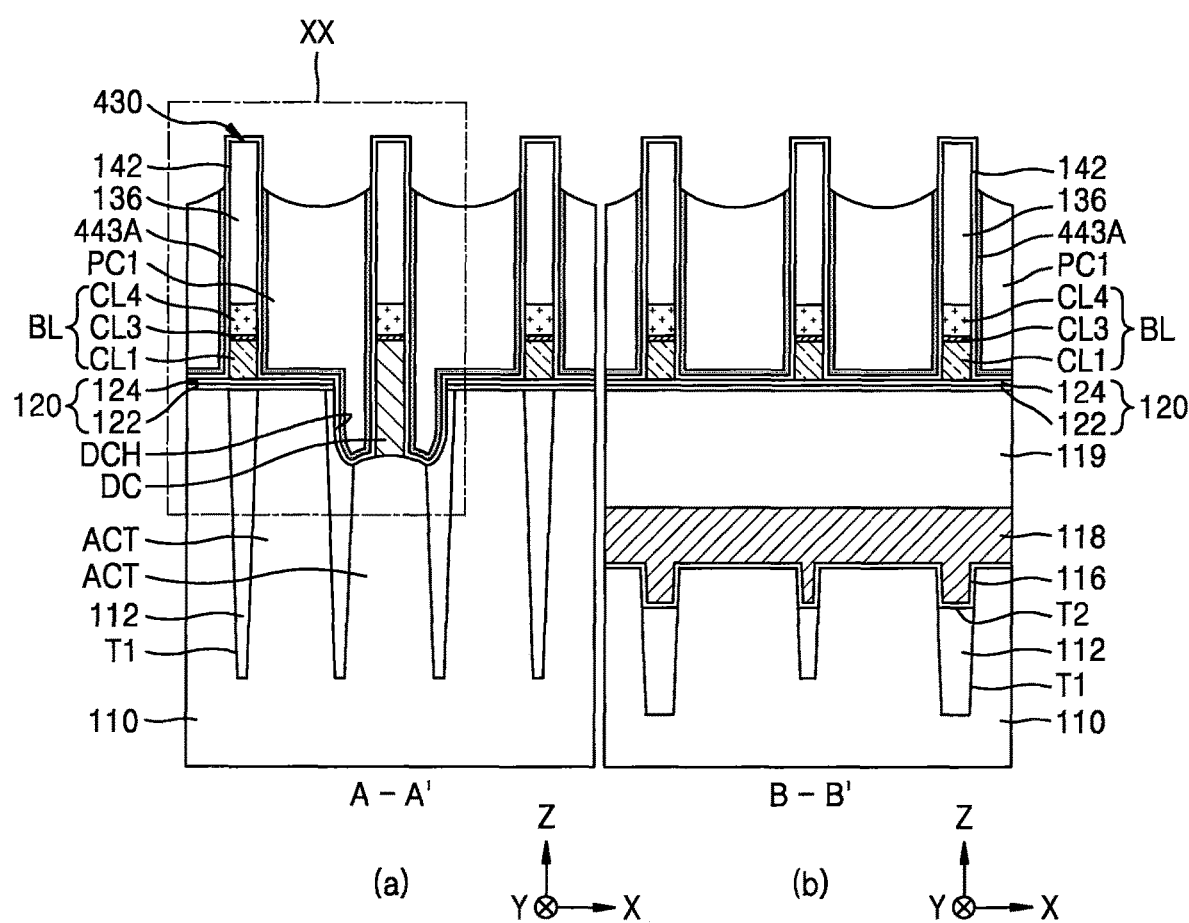
Figure 16B:
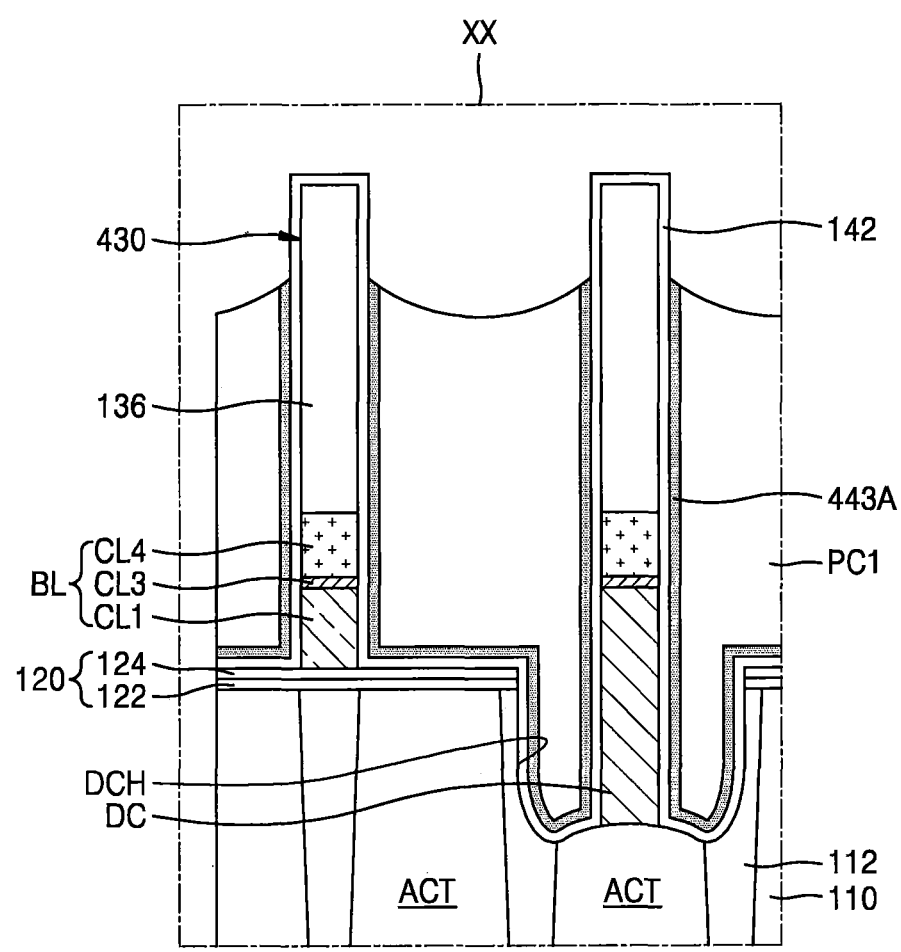

Referring to FIGS. 16A and 16B, a result product of FIG. 15A, in which the inner spacer 142 is formed, may be cleaned, followed by forming a graft polymer layer 443A on the inner spacer 142, the graft polymer layer 443A covering a sidewall of each of the plurality of conductive line structures 430.

The graft polymer layer 443A may have a top surface at a lower level than a top surface of each of the plurality of conductive line structures 430, and may conformally cover exposed surfaces in each space between the plurality of conductive line structures 430.

In some embodiments, to form the graft polymer layer 443A, the following series of processes may be performed. First, a polymer composition including an anchoring polymer having an anchoring group may be coated on the result product in which the inner spacer 142 is formed, thereby forming a polymer composition layer PC1. In some embodiments, the polymer composition layer PC1 may include only anchoring polymers having equal or similar molecular weights. For example, each of the anchoring polymers included in the polymer composition layer PC1 may have a number-average molecular weight (Mn) selected within a range of about 2,000 to about 500,000, and may have a polydispersity index (Mw/Mn) of about 1.1 or less, the polydispersity index (Mw/Mn) being a ratio of a weight-average molecular weight (Mw) to a number-average molecular weight (Mn) of each of the anchoring polymers included in the polymer composition layer PC1. However, the inventive concepts are not limited thereto.

The polymer composition layer PC1 may have a top surface at a lower level than the top surface of each of the plurality of conductive line structures 430. The top surface of the polymer composition layer PC1 may be concave due to surface tension, and the polymer composition layer PC1 may have the greatest height at an edge thereof contacting the inner spacer 142, and may have an inclined surface such that the top surface thereof has a gradually decreasing height with increasing distance from the edge thereof contacting the inner spacer 142.

A reaction between the anchoring group of the anchoring polymer and an exposed surface of the inner spacer 142 may be induced by thermally treating the polymer composition layer PC1 so that the anchoring polymer is grafted onto the surface of the inner spacer 142 contacting the polymer composition layer PC1, thereby forming the graft polymer layer 443A on the inner spacer 142. In some embodiments, the anchoring polymer may be grafted onto the surface of the inner spacer 142 by a condensation reaction between a hydroxyl group, which remains on the surface of the inner spacer 142 after the inner spacer 142 is cleaned, and a hydroxyl group which is the anchoring group of the anchoring polymer. The thermal treatment for forming the graft polymer layer 443A may be performed at about 150° C. to about 300° C. for about 60 seconds to about 300 seconds, without being limited thereto.

The anchoring polymer included in the polymer composition layer PC1 may include, for example, a vinyl polymer. For example, the anchoring polymer may include an aromatic hydrocarbon polymer, a (meth)acrylic polymer, a vinylpyridine polymer, a vinylester polymer, a vinylpyrrolidone polymer, an olefin polymer, or a copolymer including combinations thereof. When the anchoring polymer includes a copolymer, the copolymer may be a block copolymer or a random copolymer.

In some embodiments, the graft polymer layer 443A may include a polymer layer including, for example, polystyrene (PS) as a main component, or a polymer layer including poly(methyl methacrylate) (PMMA) as a main component. In some embodiments, the graft polymer layer 443A may have a thickness of about 2 nm to about 5 nm, without being limited thereto.

Figure 17A:
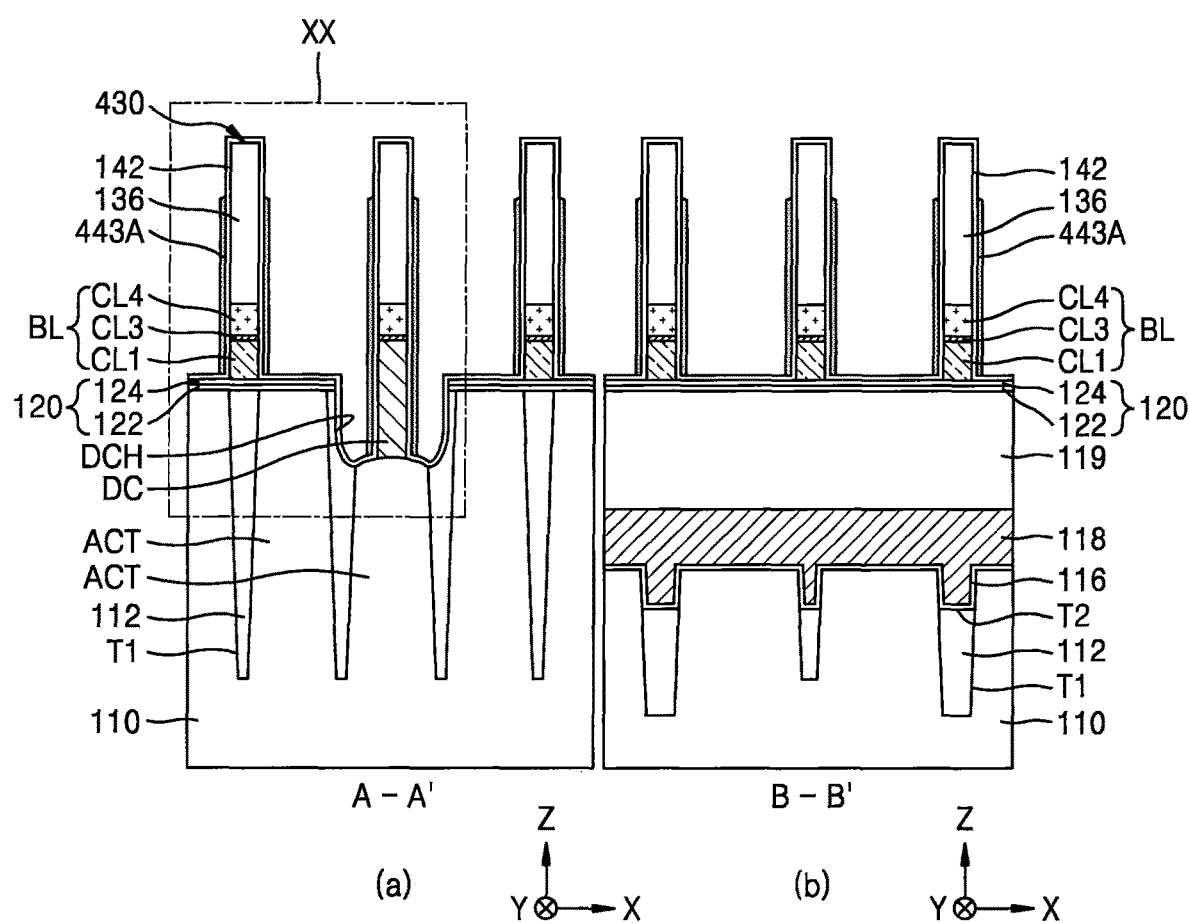
Figure 17B:
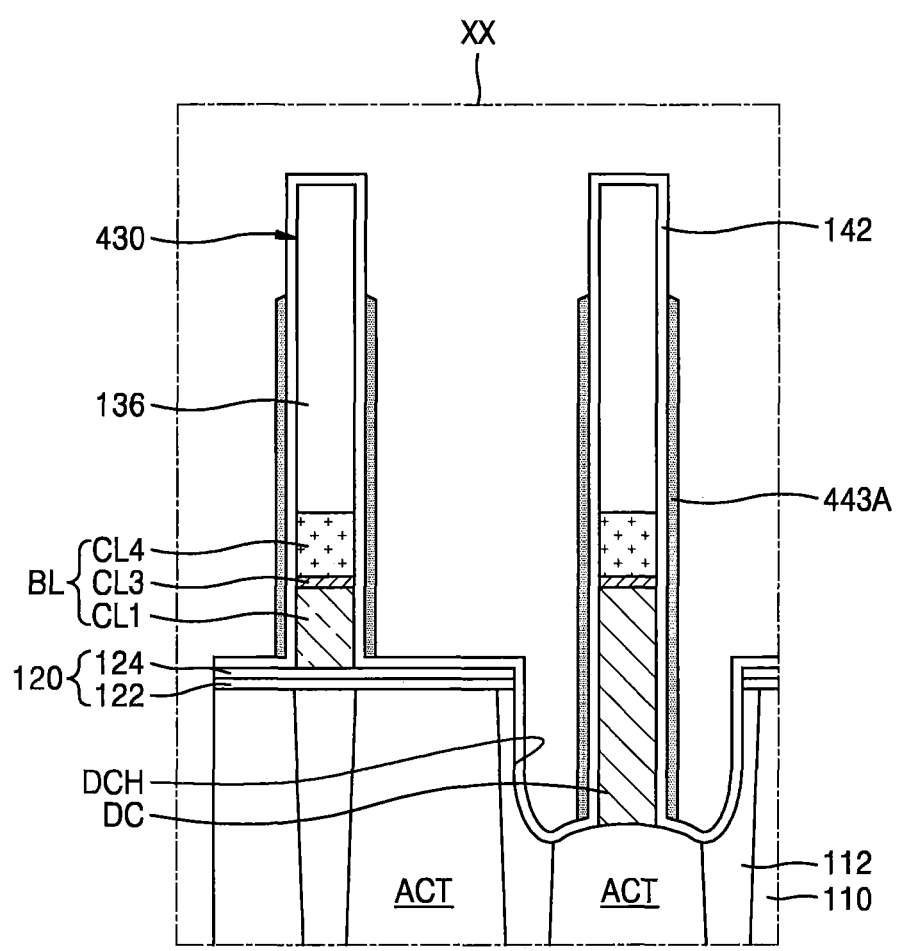

Referring to FIGS. 17A and 17B, unreacted portions of the polymer composition layer PC1 may be removed from a result product of FIG. 16A by using an organic solvent, thereby exposing the graft polymer layer 443A, and the exposed graft polymer layer 443A may be etched back, thereby removing unneeded portions of the graft polymer layer 443A except portions thereof on the sidewall of each of the plurality of conductive line structures 430. Here, a height of the graft polymer layer 443A may be reduced.

The organic solvent may include, for example, propylene glycol monomethyl ester acetate (PGMEA), propylene glycol monomethyl ester (PGME), ethyl-3-ethoxy propionate (EEP), ethyl lactate (EL), methyl 2-hydroxybutyrate (HBM), gamma-butyrolactone (GBL), or the like, without being limited thereto.

Figure 18A:
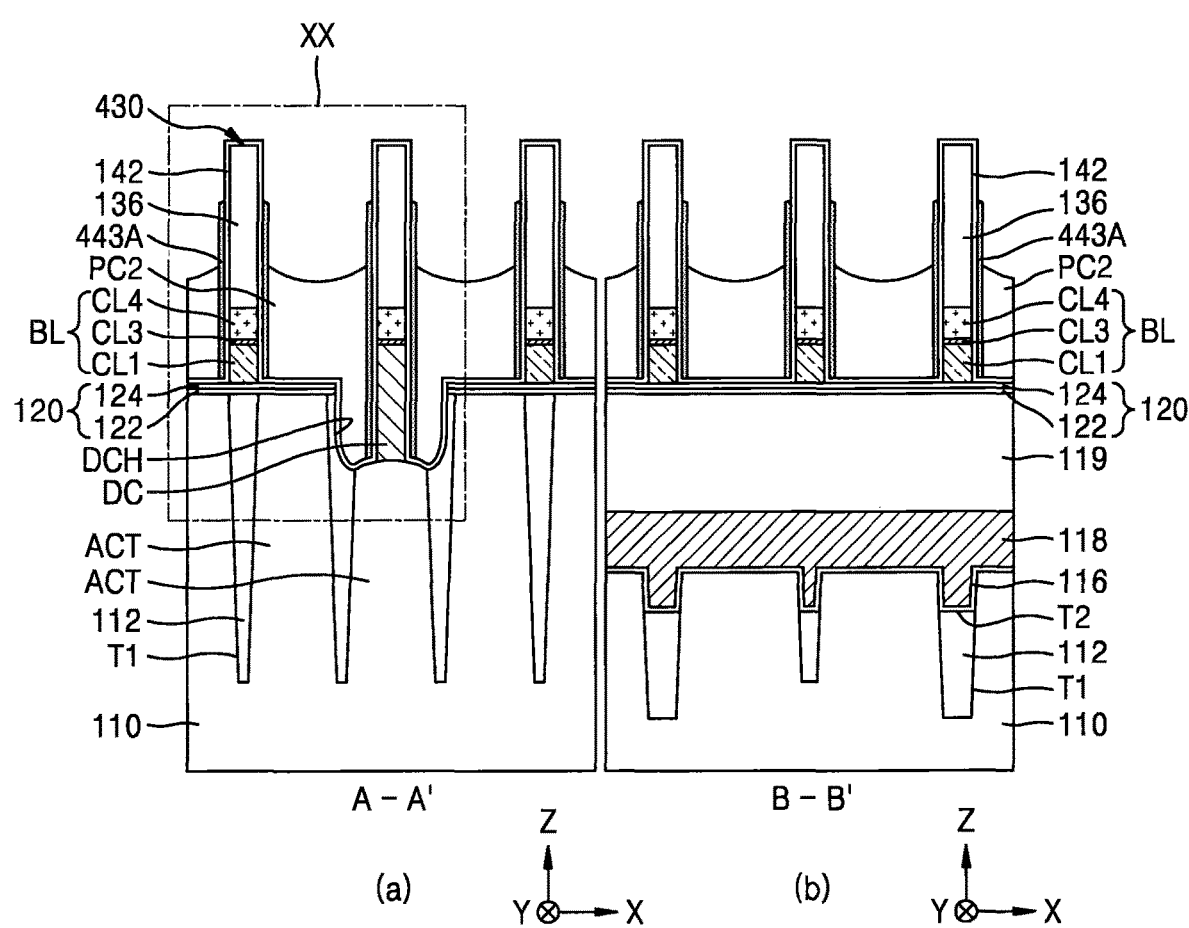
Figure 18B:
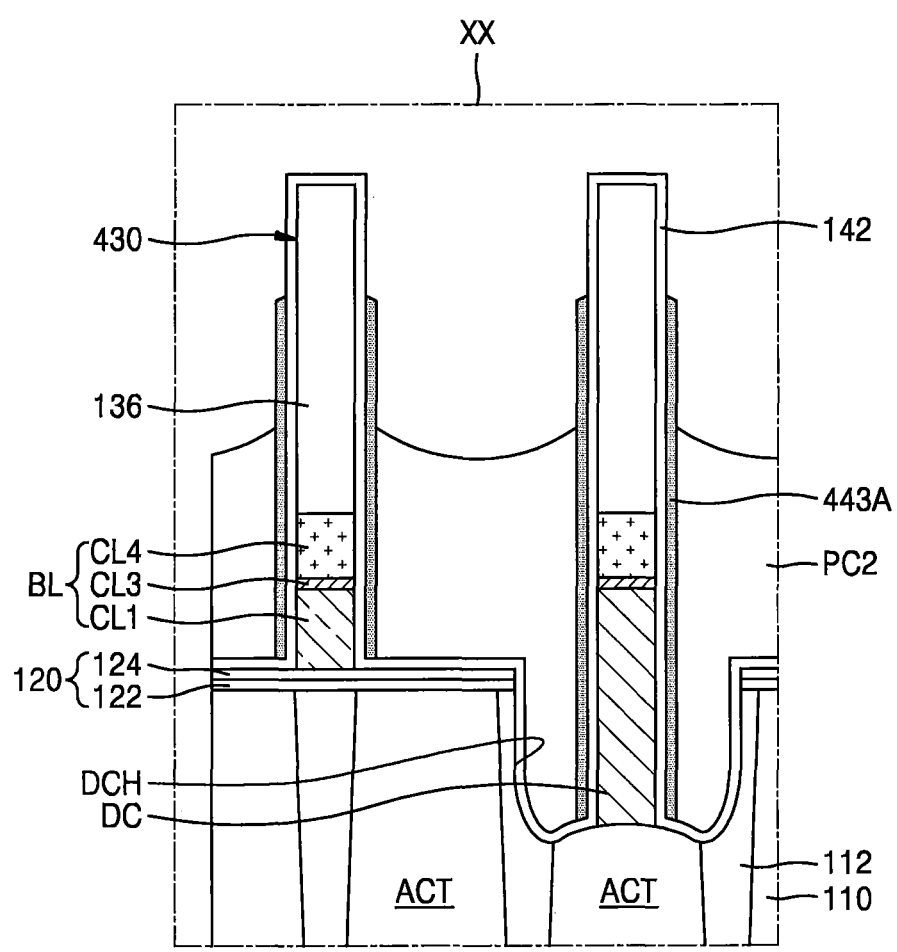

Referring to FIGS. 18A and 18B, a block copolymer layer PC2 may be formed on a result product of FIG. 17A.

The block copolymer layer PC2 may include a block copolymer including a first polymer block that has a first repeating unit and a second polymer block that has a second repeating unit. In some embodiments, the block copolymer in the block copolymer layer PC2 may include a linear or branched polymer having a molecular weight of about 3,000 g/mol to about 2,000,000 g/mol. In some embodiments, the first polymer block may include, for example, polystyrene (PS). The second polymer block may include, for example, poly(methyl methacrylate) (PMMA), poly(ethylene oxide) (PEO), poly(lactic acid) (PLA), or polyisoprene (PI). In the block copolymer, a volume ratio of the first polymer block to the second polymer block may be variously selected. For example, the volume ratio of the first polymer block to the second polymer block may range from about 20:80 to about 40:60, without being limited thereto.

In some embodiments, to form the block copolymer layer PC2, a block copolymer composition may be applied onto the result product of FIG. 17A, in which the graft polymer layer 443A is formed. For example, the block copolymer layer PC2 may be formed by a dip coating, solution coating, or spin coating process. The block copolymer layer PC2 may have a top surface having a height less than the height of the graft polymer layer 443A. The top surface of the block copolymer layer PC2 may be concave due to surface tension, and the block copolymer layer PC2 may have the greatest height at an edge thereof contacting the graft polymer layer 443A, and may have an inclined surface such that the top surface thereof has a gradually decreasing height with increasing distance from the edge thereof contacting the graft polymer layer 443A.

Figure 19A:
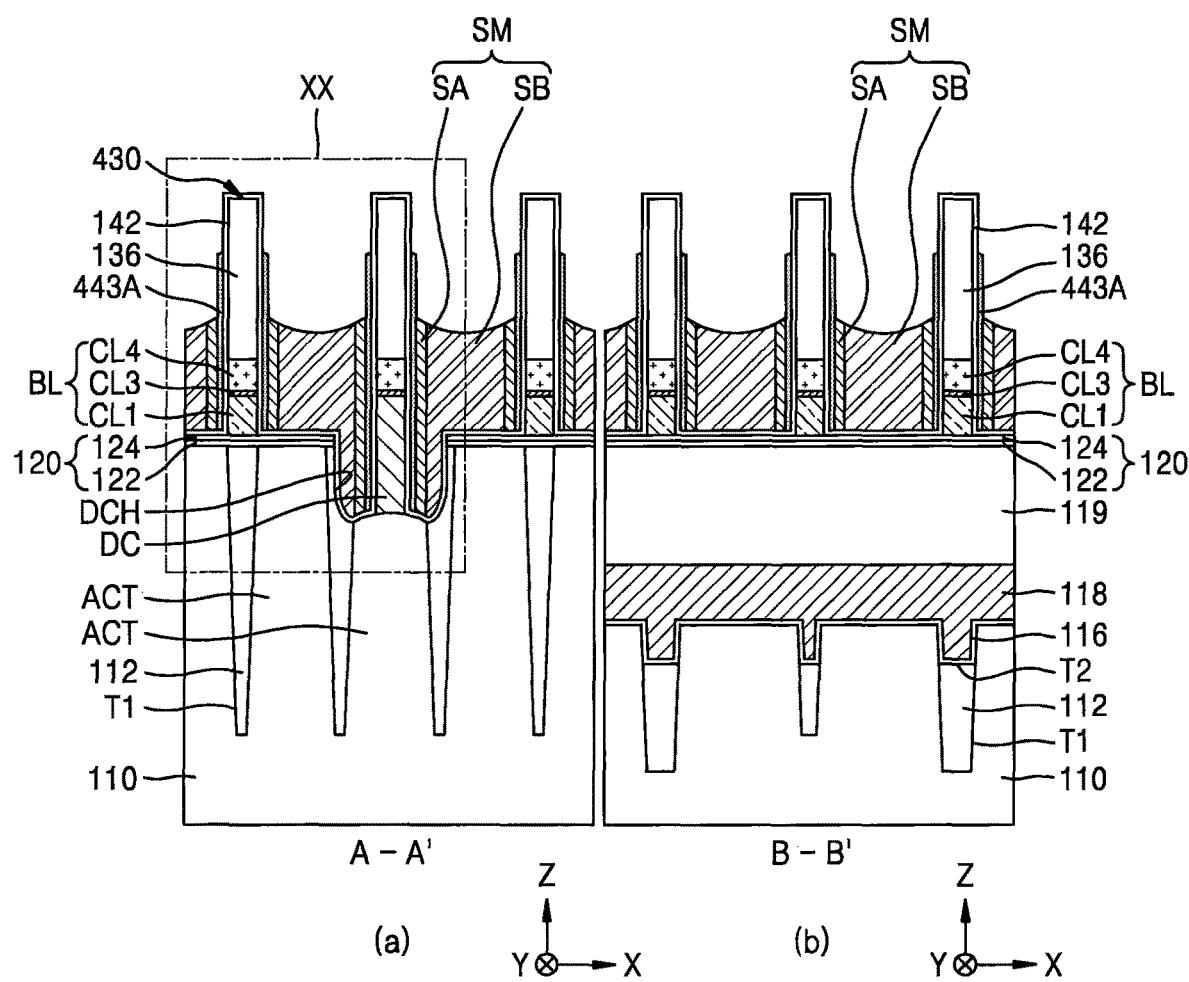
Figure 19B:
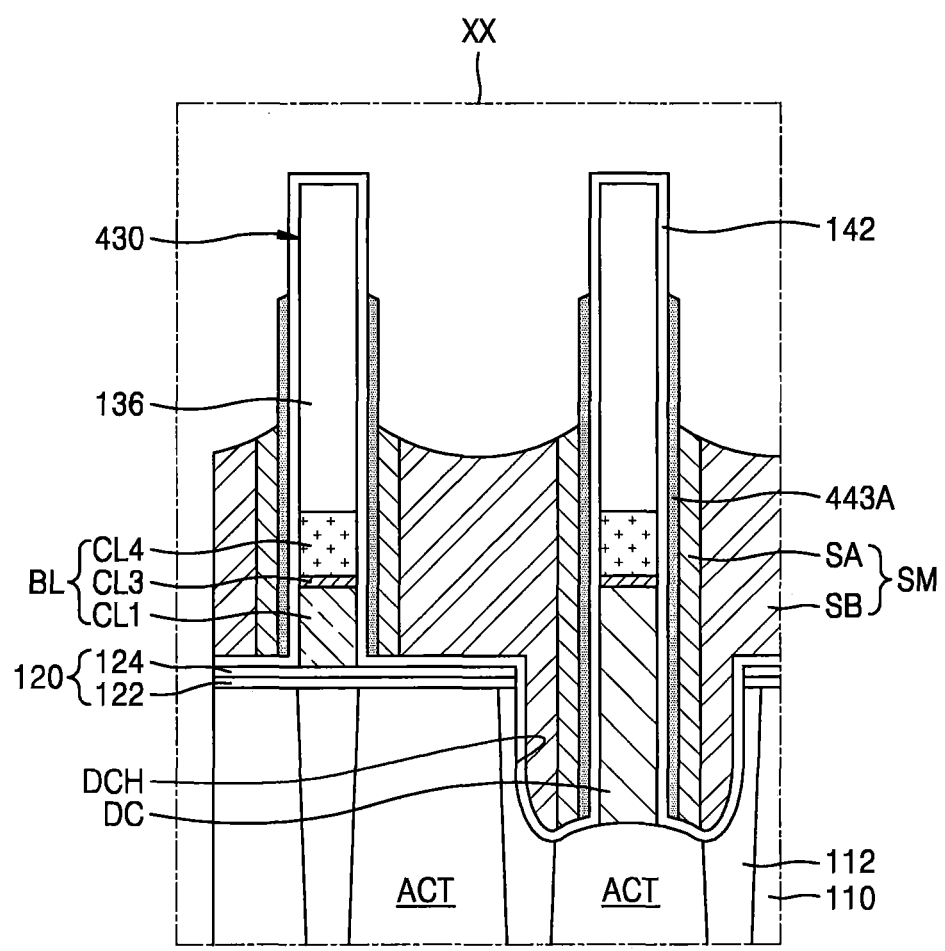

Referring to FIGS. 19A and 19B, the block copolymer layer PC2 (see FIG. 18A) may be subjected to phase separation, thereby forming a self-assembled layer SM.

The self-assembled layer SM may include a plurality of first vertical domains SA, each of which may include the first polymer block and may be vertically oriented in contact with the graft polymer layer 443A, and a second vertical domain SB, which may include the second polymer block and may be vertically oriented while spaced apart from the graft polymer layer 443A, with the first vertical domain SA being between the second vertical domain SB and the graft polymer layer 443A.

For the phase separation of the block copolymer layer PC2, the block copolymer layer PC2 may be annealed at a temperature that is higher than a glass transition temperature (Tg) of the block copolymer in the block copolymer layer PC2. For example, to perform the phase separation of the block copolymer layer PC2, the block copolymer layer PC2 may be annealed at a temperature selected within a range of about 130° C. to about 190° C. for about 1 hour to about 24 hours.

In the self-assembled layer SM, which is obtained as a result of performing the phase separation of the block copolymer layer PC2 by the method described with reference to FIG. 19A while the top surface of the block copolymer layer PC2 has been formed to be inclined due to surface tension as shown in FIGS. 18A and 18B, each of the plurality of first vertical domains SA contacting the graft polymer layer 443A may have the top surface inclined such that a height of the top surface thereof is greatest at an edge thereof contacting the graft polymer layer 443A and gradually decreases with increasing distance from the graft polymer layer 443A.

Although FIGS. 19A and 19B illustrate an example in which the self-assembled layer SM includes two first vertical domains SA and one second vertical domain SB between two adjacent conductive line structures 430, the inventive concepts are not limited to the example shown in FIG. 19A. For example, the number of repetitions and the arrangement form when the first vertical domains SA and the second vertical domains SB are arranged may be variously modified without departing from the scope of the inventive concepts. In addition, the self-assembled layer SM may include, for example, at least three vertical domains different from each other.

Figure 20A:
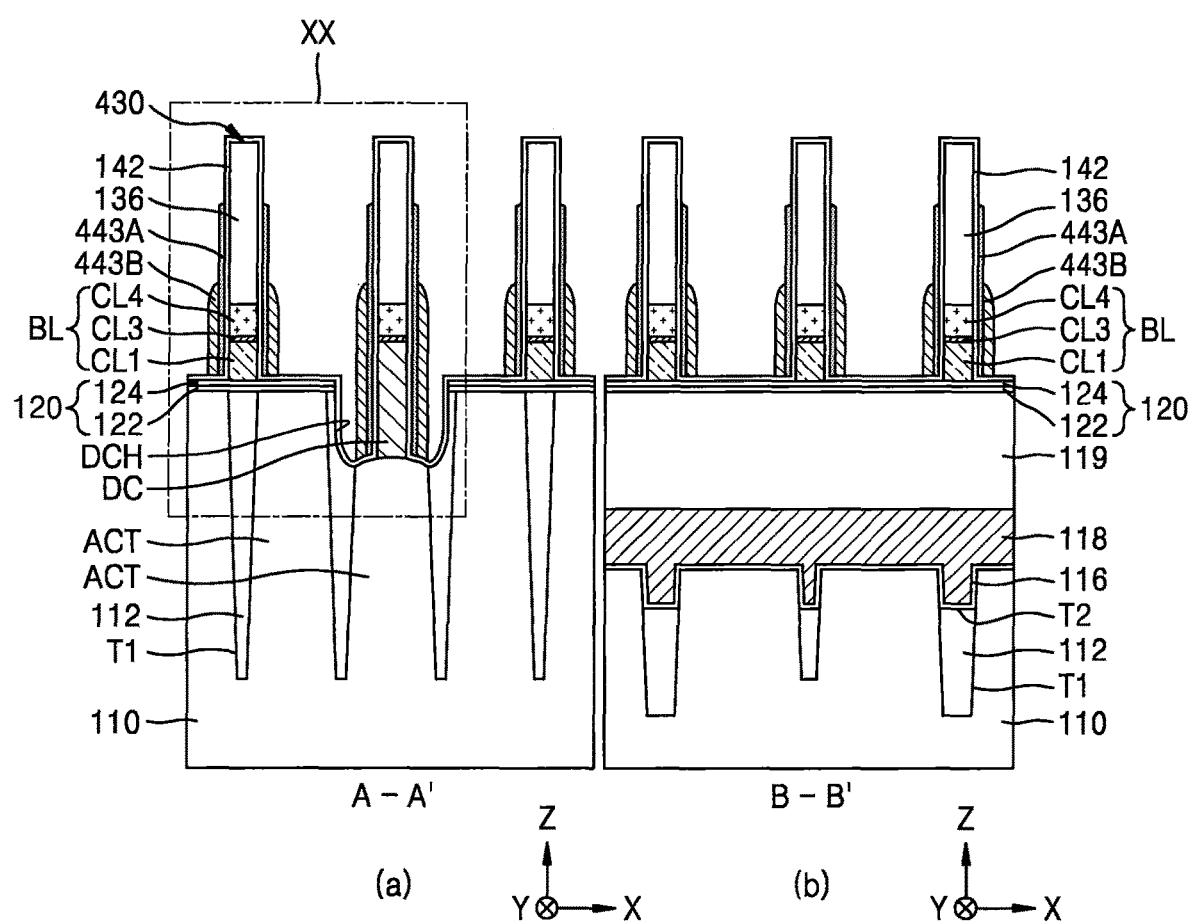
Figure 20B:
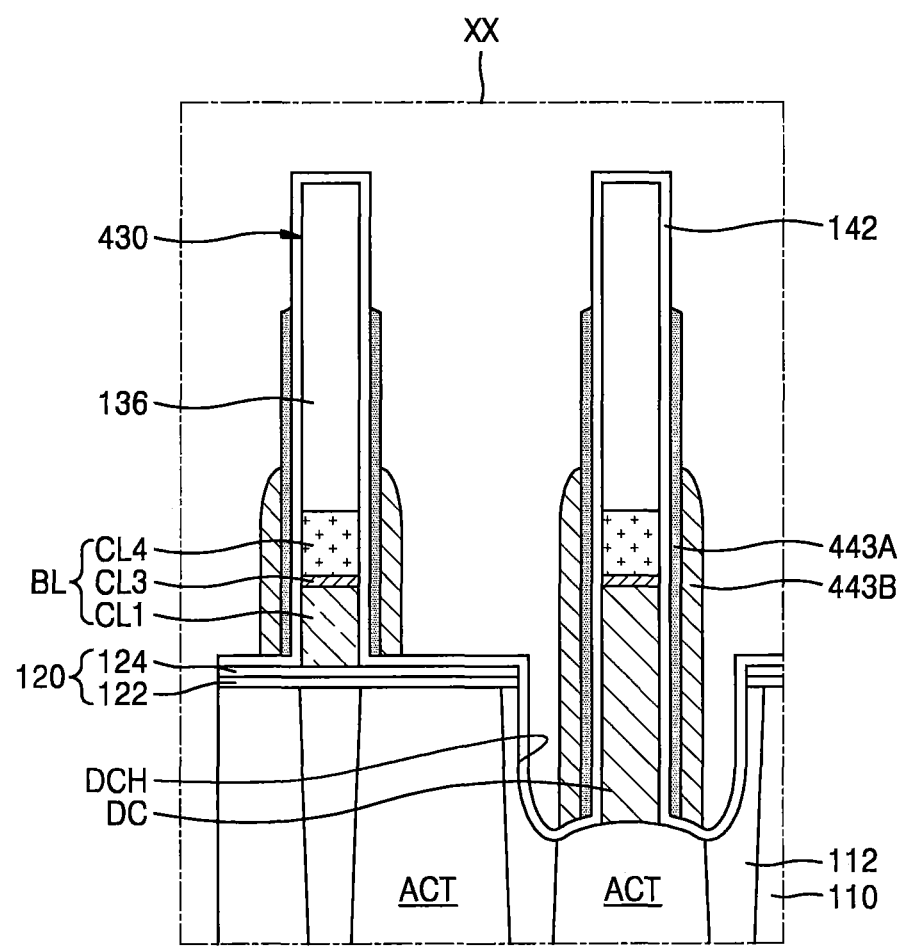

Referring to FIGS. 20A and 20B, a plurality of second vertical domains SB may be removed from the self-assembled layer SM (see FIG. 19A) such that only the plurality of first vertical domains SA out of the self-assembled layer SM remain, the plurality of first vertical domains SA each contacting the graft polymer layer 443A.

In some embodiments, to selectively remove the plurality of second vertical domains SB from the self-assembled layer SM, a wet etching process, a dry etching process, or combinations thereof may be used. In some other embodiments, to selectively remove the plurality of second vertical domains SB from the self-assembled layer SM, the plurality of second vertical domains SB may be selectively decomposed by applying a polymer decomposer to the self-assembled layer SM, and then, the plurality of decomposed second vertical domains SB may be stripped by using a cleaning solution, for example, isopropyl alcohol (IPA). In some embodiments, radiant rays or plasma may be used as the polymer decomposer. The radiant rays may be provided in an oxygen atmosphere, and may be, for example, deep ultraviolet (DUV), soft X-rays, or electron beams (E-beams). In some embodiments, the plasma may be oxygen plasma. To selectively decompose the plurality of second vertical domains SB, the kind or energy of the polymer decomposer may be selected. For example, the radiant rays or plasma having energy allowing selective decomposition of materials constituting the plurality of second vertical domains SB may be applied to the self-assembled layer SM. Radiant-rays energy or plasma energy may be adjusted by radiant-rays irradiation time or plasma exposure time.

While the plurality of second vertical domains SB are selectively removed from the self-assembled layer SM, a height of each of the plurality of graft polymer layer 443A and the plurality of first vertical domains SA, which remain on the substrate 110, may be reduced. Portions of the plurality of first vertical domains SA of the self-assembled layer SM, which remain on the substrate 110 after the plurality of second vertical domains SB are removed, may remain as a plurality of vertical domain layers 443B. The plurality of vertical domain layers 443B may have a substantially identical configuration to the plurality of vertical domain layers 143B described with reference to FIG. 4. Each of the plurality of vertical domain layers 443B may have a top surface inclined such that a height of the top surface thereof is greatest at an edge thereof contacting the graft polymer layer 443A and gradually decreases with increasing distance from the graft polymer layer 443A. In some embodiments, each of the plurality of vertical domain layers 443B may have a width of about 2 nm to about 5 nm in the X direction.

Figure 21A:
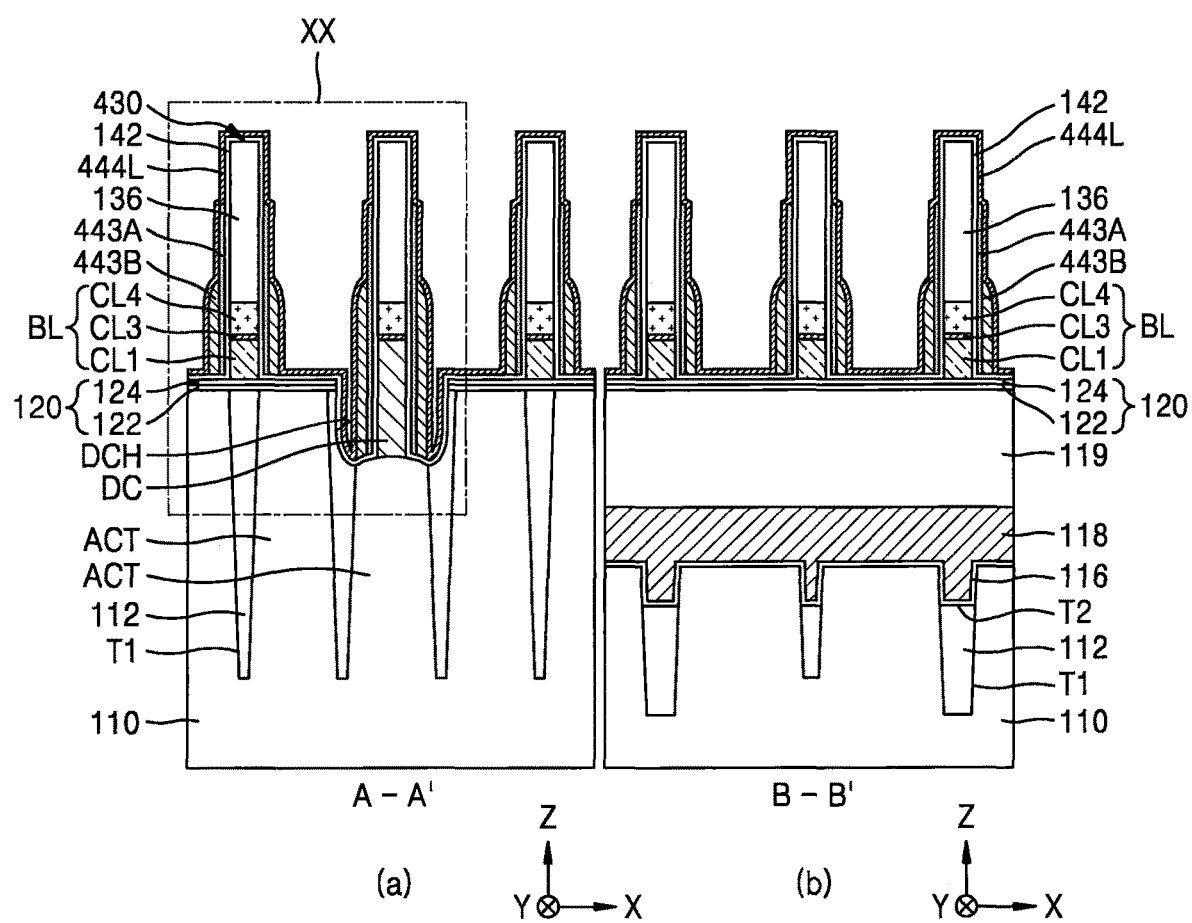
Figure 21B:
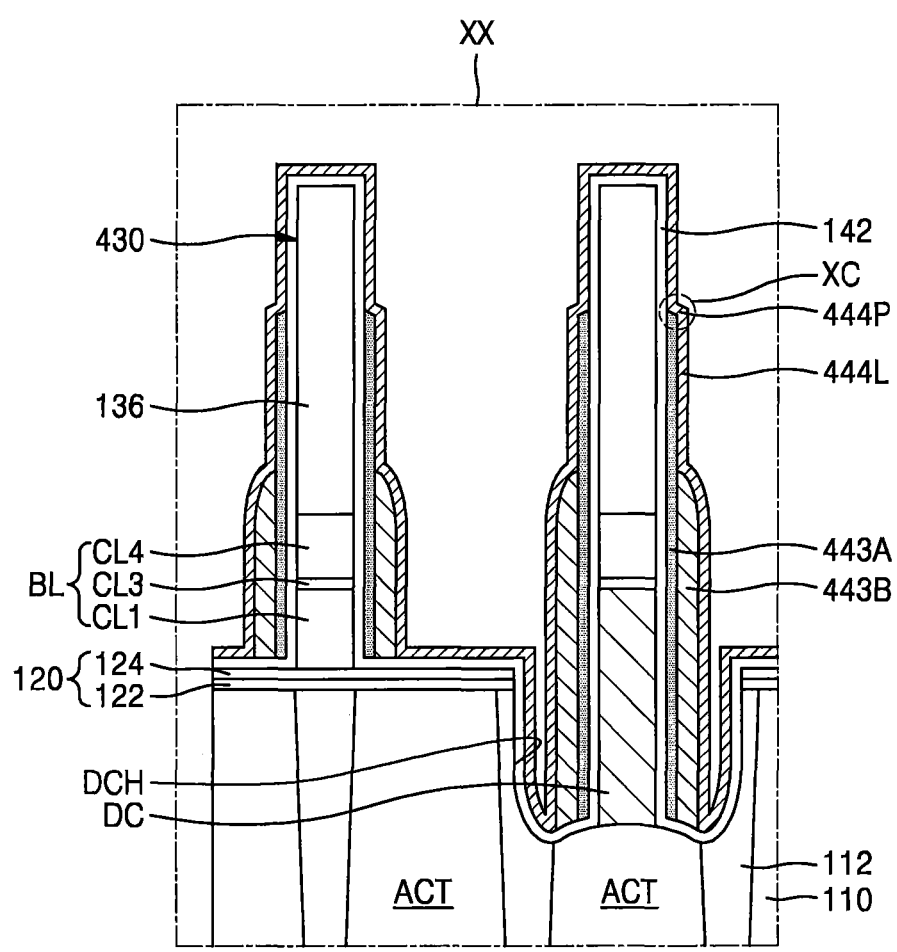

Referring to FIGS. 21A and 21B, a first insulating spacer film 444L may be formed on a result product of FIG. 20A, in which the plurality of vertical domain layers 443B remain after the plurality of second vertical domains SB are removed, the first insulating spacer film 444L conformally covering exposed surfaces of the inner spacer 142 and exposed surfaces of a plurality of graft polymer layers 443A and the plurality of vertical domain layers 443B. After the first insulating spacer film 444L is formed, the plurality of graft polymer layers 443A and the plurality of vertical domain layers 443B may be surrounded by the inner spacer 142 and the first insulating spacer film 444L.

In some embodiments, to form the first insulating spacer film 444L, an ALD process may be performed. The first insulating spacer film 444L may include, for example, a silicon oxide film.

As shown in a region indicated by "XC" in FIG. 21B, a portion of the first insulating spacer film 444L, which covers an uppermost surface of each graft polymer layer 443A, may include a step 444P. The step 444P of the first insulating spacer film 444L may include a portion protruding approximately in the X direction or a similar direction thereto.

As described with reference to FIGS. 20A and 20B, since each of the plurality of vertical domain layers 443B has the top surface inclined such that the height of the top surface thereof is greatest at the edge thereof contacting the graft polymer layer 443A and gradually decreases with increasing distance from the graft polymer layer 443A, a portion of the first insulating spacer film 444L, which covers a top surface of each first vertical domain layer 443B, may have a step that is more gently inclined than the step 444P.

Figure 22A:
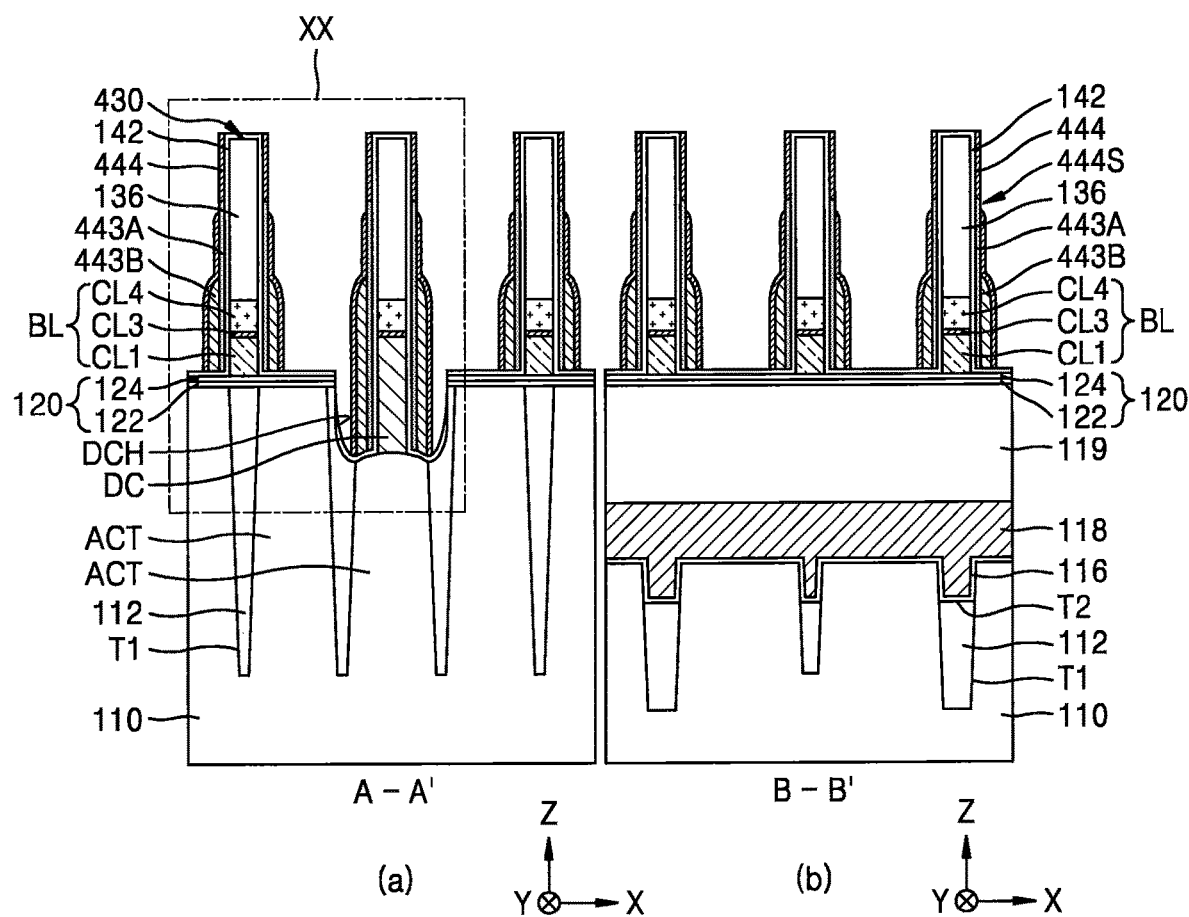
Figure 22B:
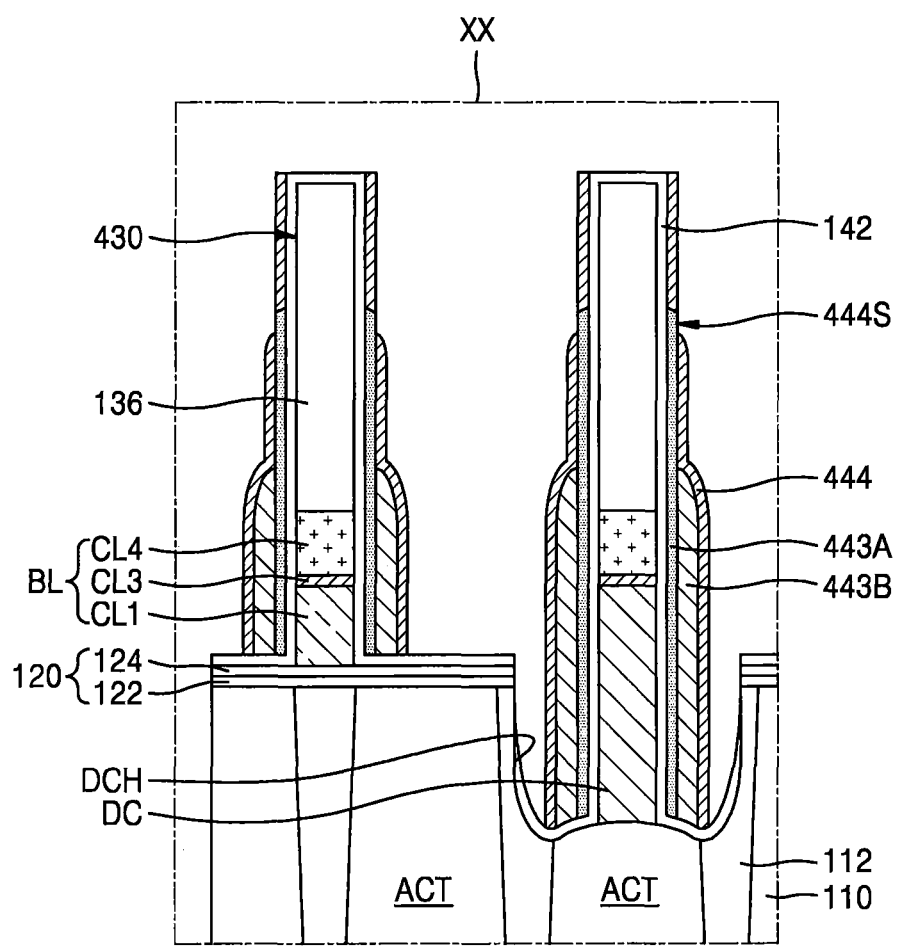

Referring to FIGS. 22A and 22B, the first insulating spacer film 444L (see FIG. 21A) may be partially removed, thereby forming a first insulating spacer 444 which includes a slit portion 444S exposing the graft polymer layer 443A.

To form the first insulating spacer 444 including the slit portion 444S, the first insulating spacer film 444L may be etched back from a result product of FIG. 21A. As a result, portions of the first insulating spacer film 444L, which cover the substrate 110 between the plurality of conductive line structures 430, portions of the first insulating spacer film 444L, which cover the top surface of each of the plurality of conductive line structures 430, and a portion of the step 444P of the first insulating spacer film 444L may be removed together. As such, the portion of the step 444P of the first insulating spacer film 444L is removed, whereby the first insulating spacer 444, which includes the slit portion 444S exposing the graft polymer layer 443A, may be obtained. The slit portion 444S may have a shape extending in the Y direction. In some embodiments, the slit portion 444S may include an opening having a width of about 2 nm to about 5 nm.

Figure 23A:
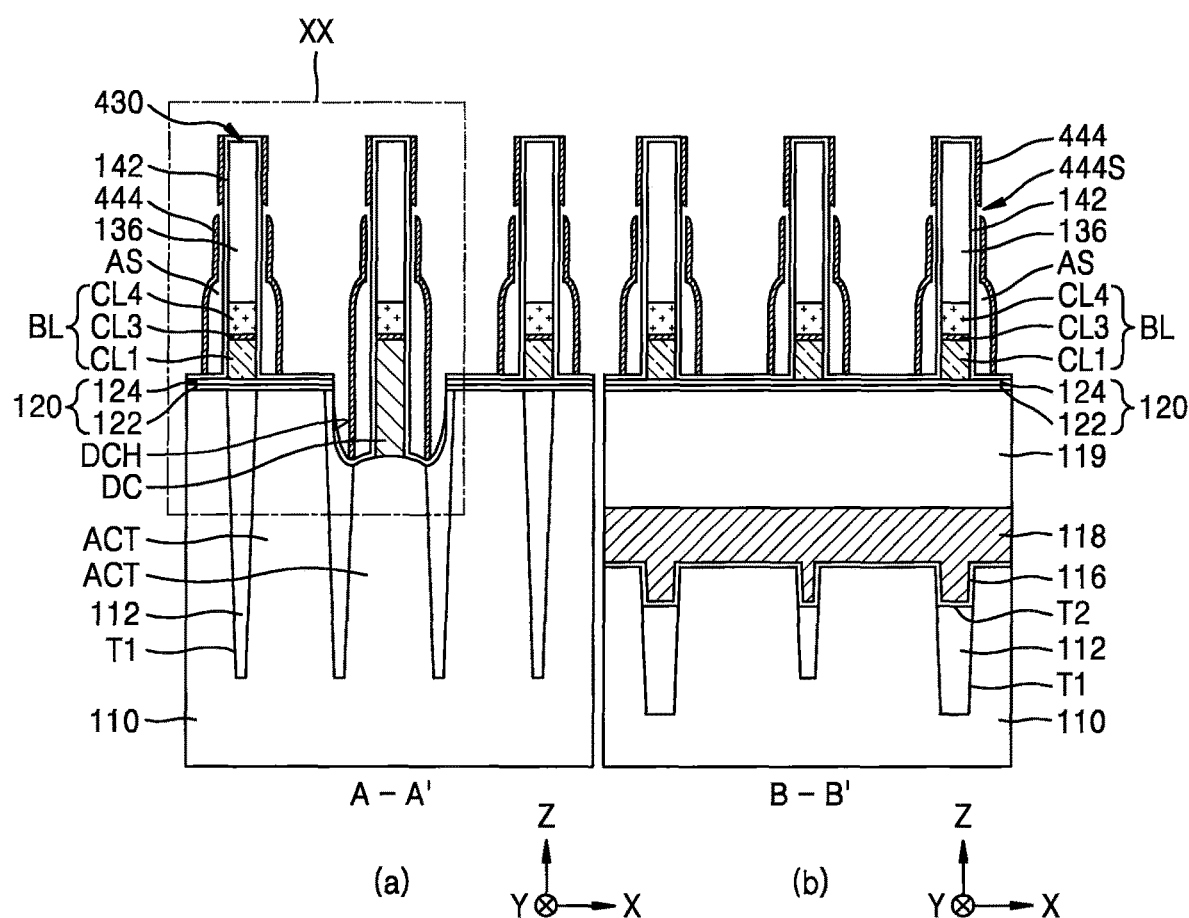
Figure 23B:
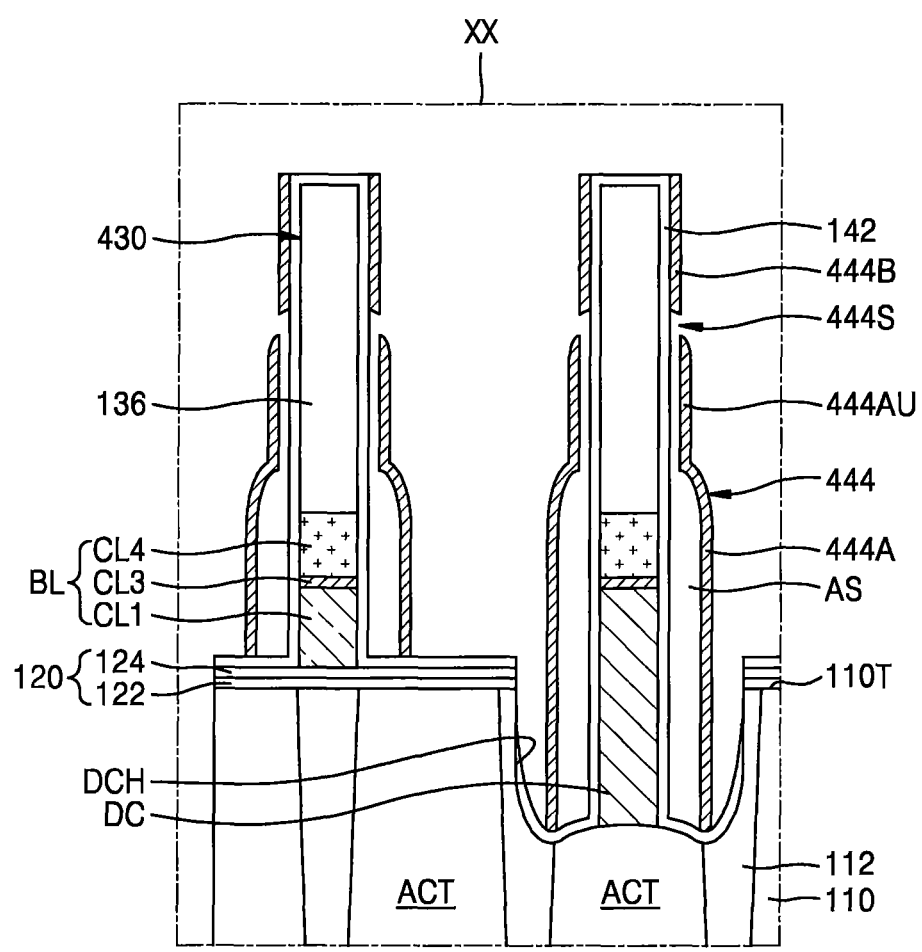

Referring to FIGS. 23A and 23B, the graft polymer layer 443A and a vertical domain layer 443B may be removed via the slit portion 444S of the first insulating spacer 444, thereby forming an air spacer AS between the inner spacer 142 and the first insulating spacer 444.

The first insulating spacer 444 may include a lower insulating portion 444A extending in the Y direction between the substrate 110 and the slit portion 444S, and an upper insulating portion 444B spaced apart from the lower insulating portion 444A with the slit portion 444S therebetween and contacting the inner spacer 142.

In some embodiments, to remove the graft polymer layer 443A and the vertical domain layer 443B, an ashing process and a cleaning process may be performed. In the cleaning process, a spin process using a cleaning solution may be performed. Here, an upper portion 444AU of the lower insulating portion 444A, which is adjacent to the slit portion 444S, may be formed to extend substantially in a vertical direction (Z direction) with respect to the top surface 110T of the substrate 110. In this case, the first insulating spacer 444 may have a substantially identical structure to the first insulating spacer 144 shown in FIGS. 2A to 2E and/or FIG. 3.

In some embodiments, in the case where a cleaning process is performed after an ashing process for removing the graft polymer layer 443A and the vertical domain layer 443B, while a solvent, which is a component of a cleaning solution, is volatilized, the upper portion 444AU of the lower insulating portion 444A may be inclined toward the inner spacer 142 by the action of van der Waals force between the inner spacer 142 and the upper portion 444AU of the lower insulating portion 444A, which is adjacent to the slit portion 444S. As a result, unlike in the example shown in FIGS. 23A and 23B, the upper portion 444AU of the lower insulating portion 444A, which is adjacent to the slit portion 444S, may have a shape extending in an inclined direction such that the upper portion 444AU is gradually closer to the inner spacer 142 with increasing distance from the substrate 110. In this case, the first insulating spacer 444 may have a substantially identical structure to the first insulating spacer 244 shown in FIGS. 5 and/or 6.

In some embodiments, in the case where a cleaning process is performed after an ashing process for removing the graft polymer layer 443A and the vertical domain layer 443B, while a solvent, which is a component of a cleaning solution, is volatilized, the upper portion 444AU of the lower insulating portion 444A may be inclined toward the inner spacer 142 such that an uppermost portion of the lower insulating portion 444A, which defines the slit portion 444S, is brought into contact with the inner spacer 142. Thus, the upper portion 444AU of the lower insulating portion 444A, which is adjacent to the slit portion 444S, may be gradually closer to the inner spacer 142 with increasing distance from the substrate 110, and the uppermost portion of the lower insulating portion 444A may contact the inner spacer 142, whereby an entrance of the air spacer AS may be closed. In this case, the first insulating spacer 444 may have a substantially identical structure to the first insulating spacer 344 shown in FIGS. 7 and/or 8.

Figure 24A:
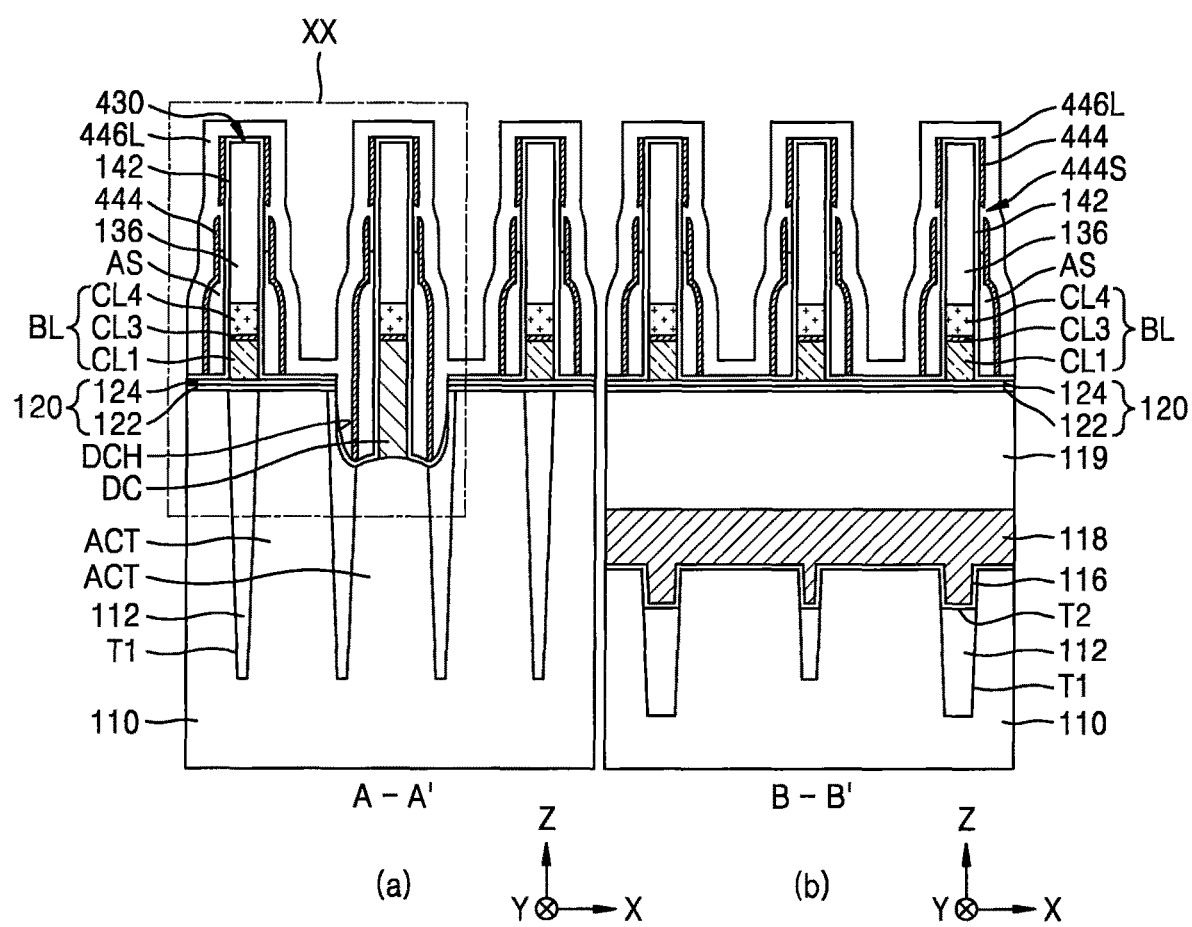
Figure 24B:
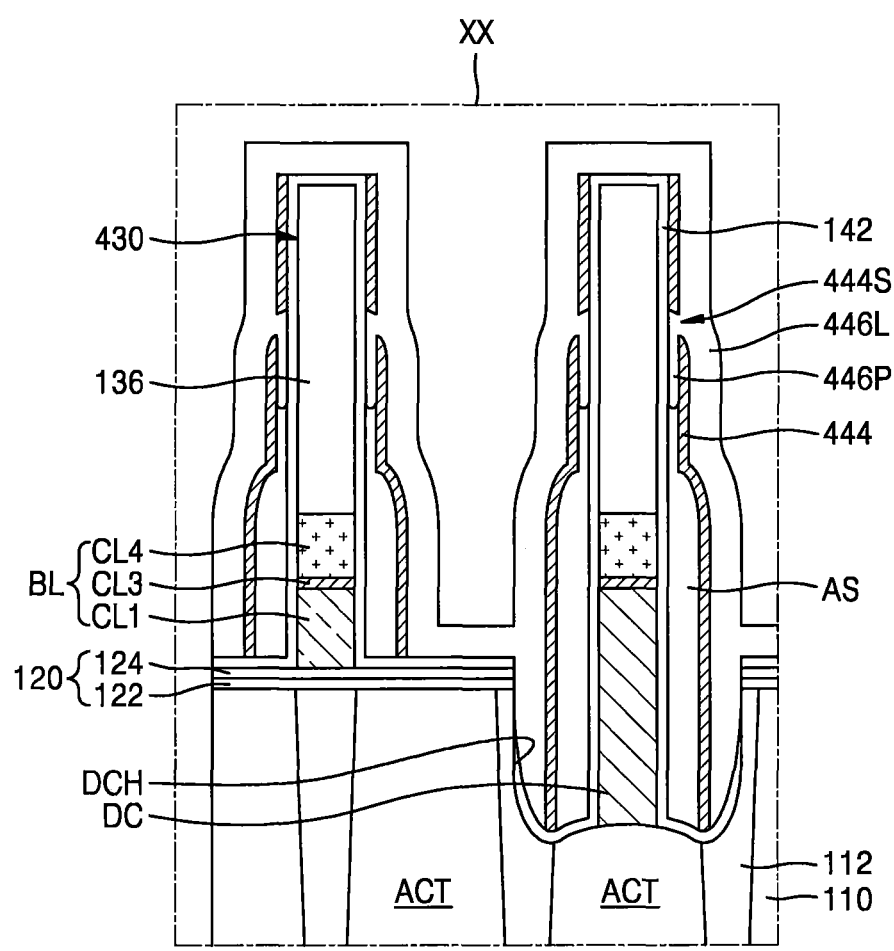

Referring to FIGS. 24A and 24B, a second insulating spacer film 446L may be formed on a result product in which the air spacer AS is formed in the lower insulating portion 444A of the first insulating spacer 444.

The second insulating spacer film 446L may conformally cover the first insulating spacer 444. The second insulating spacer film 446L may include an insertion portion 446P penetrating the slit portion 444S and extending to a space between the inner spacer 142 and the first insulating spacer 444. The insertion portion 446P may be formed by an inflow of a constituent material of the second insulating spacer film 446L into the air spacer AS via the slit portion 444S during the formation of the second insulating spacer film 446L. Similarly to the insertion portion 146P shown in FIG. 2D, the insertion portion 446P may have a line shape extending in the Y direction. The second insulating spacer film 446L may include, for example, a silicon nitride film, an SiOCN film, an SiCN film, or combinations thereof.

In some embodiments, in the case where the upper portion 444AU of the lower insulating portion 444A of the first insulating spacer 444 obtained after the removal of the graft polymer layer 443A and the vertical domain layer 443B, as described with reference to FIGS. 23A and 23B, has a shape extending in an inclined direction such that the upper portion 444AU is gradually closer to the inner spacer 142 with increasing distance from the substrate 110, like in the first insulating spacer 244 shown in FIGS. 5 and/or 6, the insertion portion 446P may have a smaller size than that shown in FIG. 24A.

In some embodiments, in the case where the entrance of the air spacer AS is closed since the uppermost portion of the lower insulating portion 444A of the first insulating spacer 444 obtained after the removal of the graft polymer layer 443A and the vertical domain layer 443B, as described with reference to FIGS. 23A and 23B, contacts the inner spacer 142, like in the first insulating spacer 344 shown in FIGS. 7 and/or 8, the insertion portion 446P may not be formed.

Figure 25A:
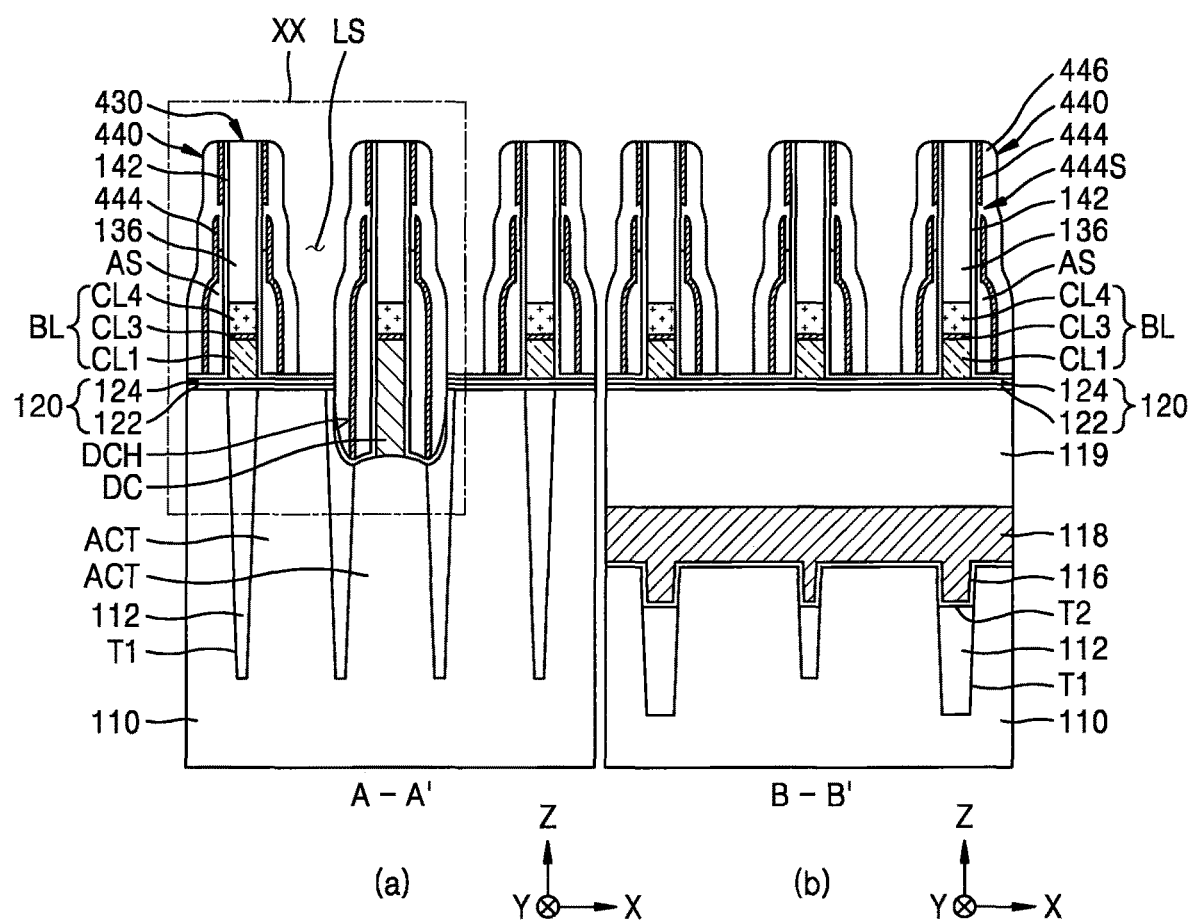
Figure 25B:
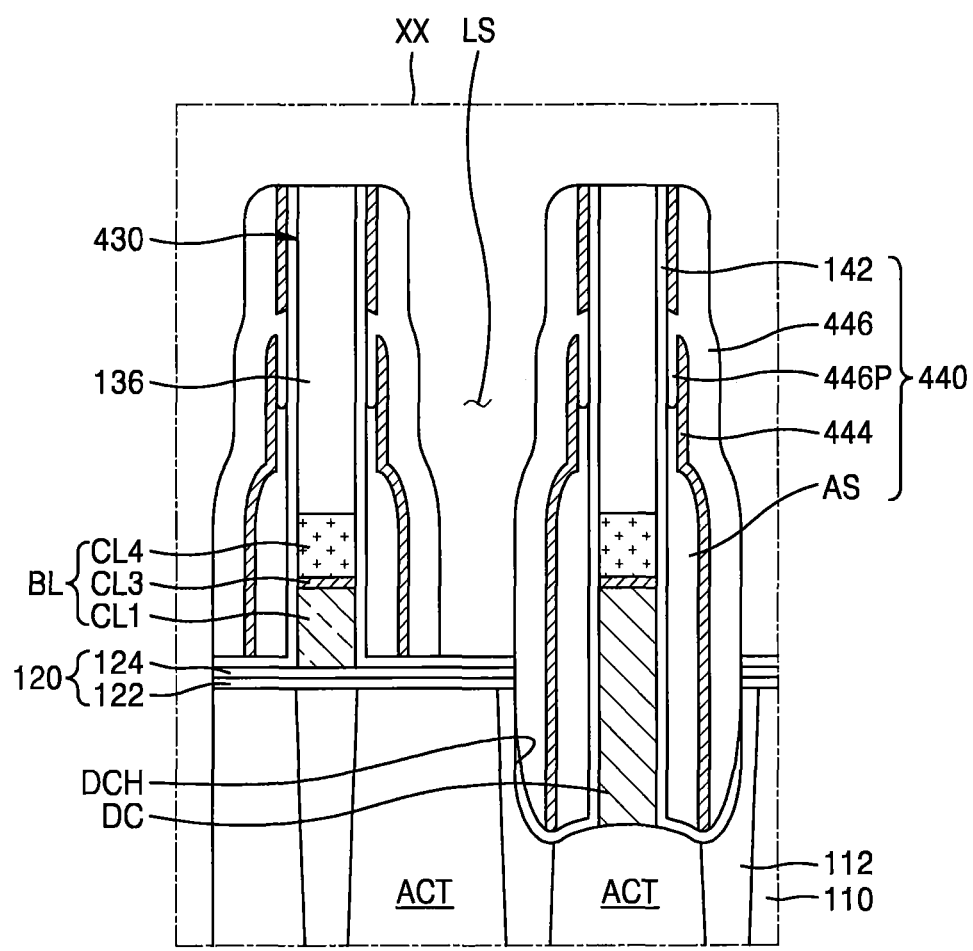

Referring to FIGS. 25A and 25B, the second insulating spacer film 446L may be etched back, thereby forming a plurality of second insulating spacers 446 from the second insulating spacer film 446L, the plurality of second insulating spacers 446 each covering the sidewall of each of the plurality of conductive line structures 430.

After the plurality of second insulating spacers 446 are formed, each line space LS extending in the Y direction may be defined between the plurality of conductive line structures 430, over the insulating film 120.

Figure 26:
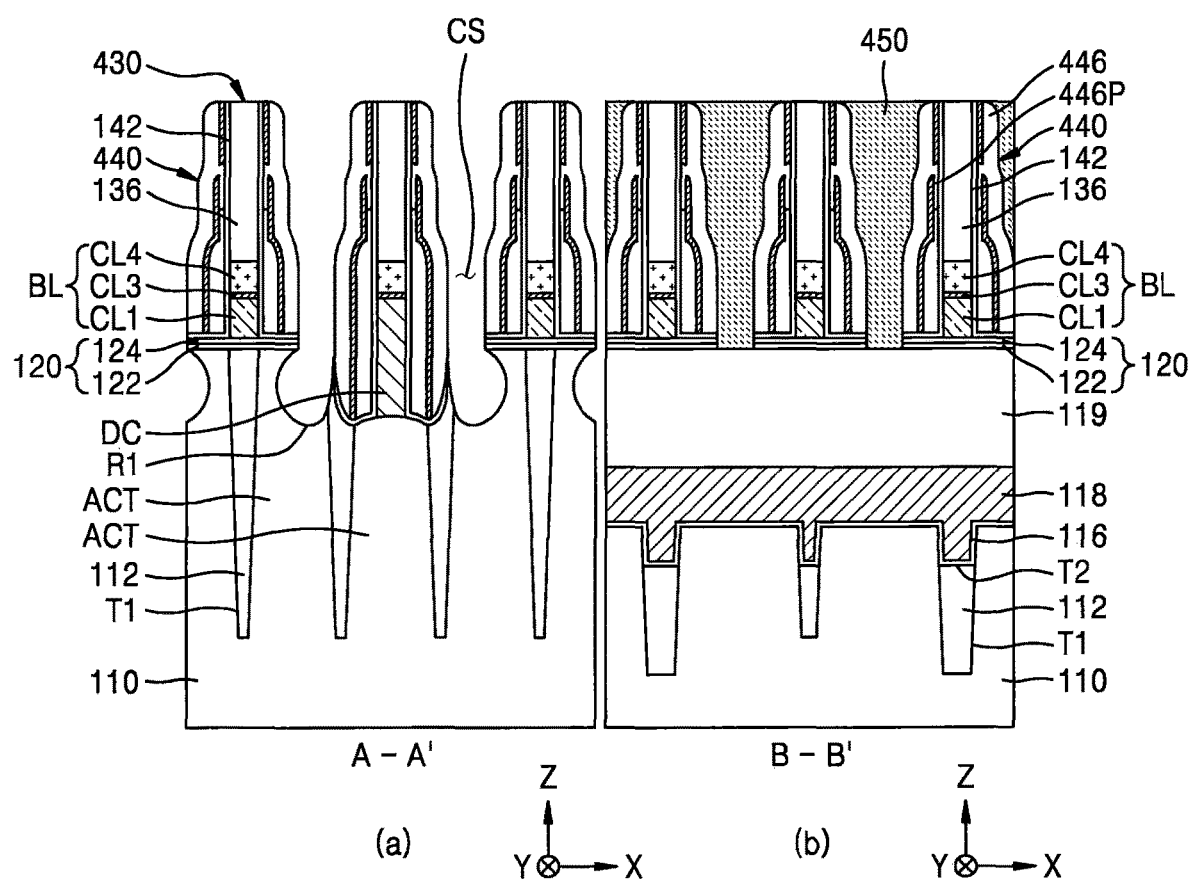

Referring to FIG. 26, a plurality of insulating fences 450 for separating each line space LS between the plurality of conductive line structures 430 into a plurality of contact spaces CS may be formed. Each of the plurality of insulating fences 450 may have a shape of an insulating plug over the word line 118, the insulating plug vertically overlapping the word line 118. Thus, one line space LS may be separated into the plurality of contact spaces CS having pillar shapes by the plurality of insulating fences 450 formed in the one line space LS. Each of the plurality of insulating fences 450 may include a silicon nitride film. In some embodiments, the plurality of insulating capping patterns 136 and films therearound may be exposed to an etching process atmosphere accompanied with the formation of the plurality of insulating fences 450 while the plurality of insulating fences 450 are formed, and thus be partially consumed, and as a result, heights of partial regions of the plurality of insulating capping patterns 136 and the films therearound may be reduced.

Next, structures exposed by the plurality of contact spaces CS may be partially removed, thereby forming a plurality of recess spaces R1 exposing the active region ACT between the plurality of bit lines BL.

To form the plurality of recess spaces R1, anisotropic etching, isotropic etching, or combinations thereof may be used. For example, an anisotropic etching process may be performed to etch the second insulating film 124 and the first insulating film 122 among the structures exposed by the plurality of contact spaces CS between the plurality of bit lines BL, in this stated order, and the active region ACT of the substrate 110 exposed as a result of the etching of the first insulating film 122 may be partially removed by an isotropic etching process, thereby forming the plurality of recess spaces R1. Each of the plurality of recess spaces R1 may communicate with a contact space CS. The active region ACT of the substrate 110 may be exposed by the plurality of recess spaces R1.

Figure 27:
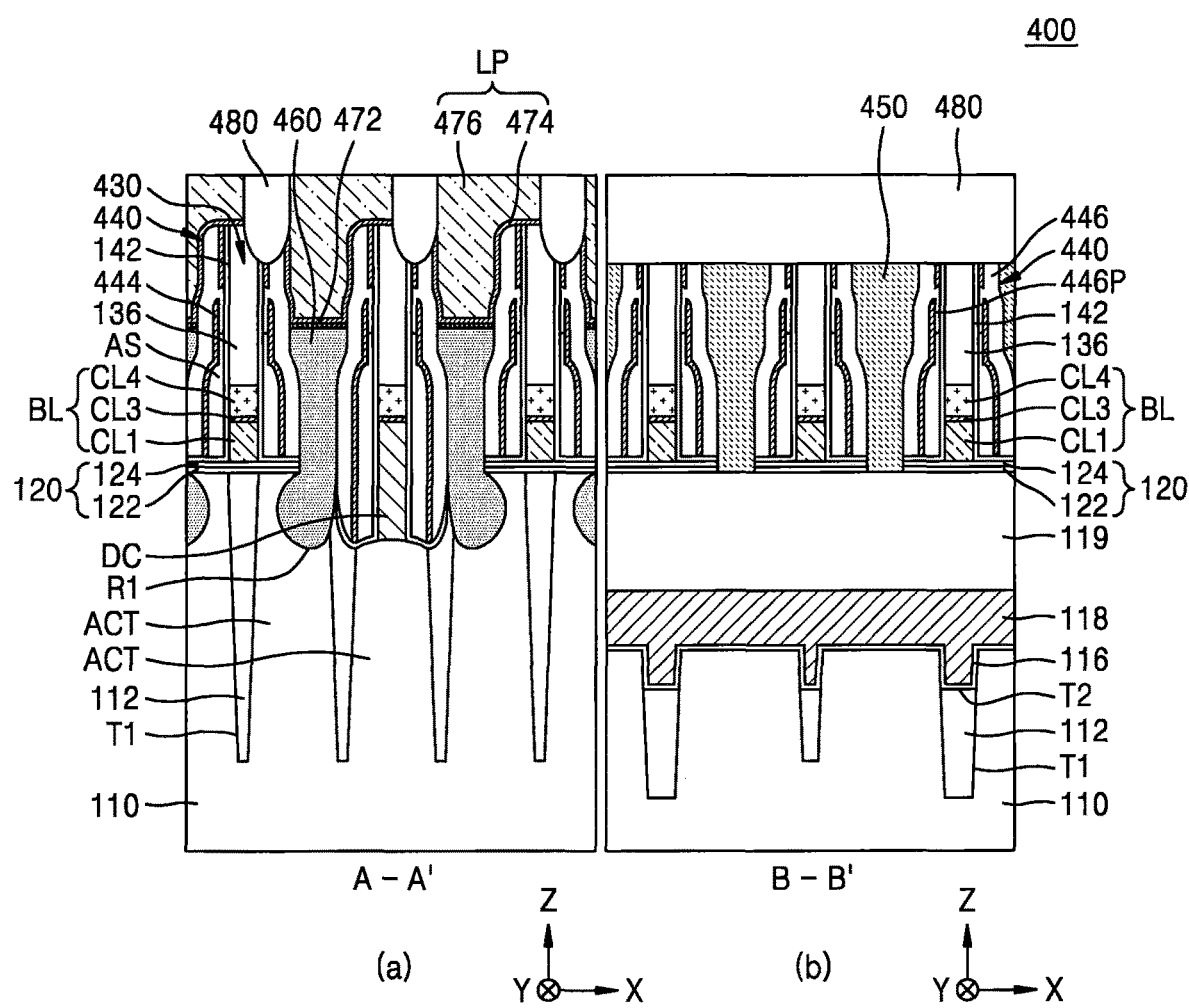

Referring to FIG. 27, a plurality of conductive plugs 460 may be formed, the plurality of conductive plugs 460 each partially filling the contact space CS between the plurality of bit lines BL while filling the plurality of recess spaces R1 between the plurality of bit lines BL.

To form the plurality of conductive plugs 460, a conductive layer, which covers top surfaces of the plurality of insulating capping patterns 136 and the plurality of insulating fences 450 while filling the plurality of recess spaces R1 and the plurality of contact spaces CS in a result product of FIG. 26, may be formed, followed by removing an upper portion of the conductive layer by etch-back, whereby the top surfaces of the plurality of insulating capping patterns 136 and the plurality of insulating fences 450 may be exposed, and an upper space at an entrance side of each of the plurality of contact spaces CS may be emptied again. Remaining portions of the conductive layer that are not removed may constitute the plurality of conductive plugs 460. Each of the plurality of conductive plugs 460 may include, for example, doped polysilicon.

A metal silicide film 472 and a conductive landing pad LP may be formed on each conductive plug 460 in this stated order. A plurality of conductive landing pads LP may extend over the insulating capping patterns 136 to vertically partially overlap the plurality of conductive line structures 430 while filling the plurality of contact spaces CS (see FIG. 26) over metal silicide films 472. Each of the plurality of conductive landing pads LP may include a conductive barrier film 474 and a conductive layer 476 on the conductive barrier film 474, the conductive layer 476 extending over each of the plurality of conductive line structures 430 while filling a remaining space of the contact space CS over the conductive barrier film 474. The conductive barrier film 474 may include, for example, a T1/TiN stacked structure. The conductive layer 476 may include, for example, a metal, a metal nitride, conductive polysilicon, or combinations thereof. For example, the conductive layer 476 may include tungsten (W).

A mask pattern (not shown), which partially exposes the conductive layer 476, may be formed on the conductive layer 476, followed by etching the conductive barrier film 474, the conductive layer 476, and insulating films therearound by using the mask pattern as an etch mask, thereby forming the plurality of conductive landing pads LP, which include remaining portions of the conductive barrier film 474 and the conductive layer 476. The mask pattern may include, for example, a silicon nitride film, without being limited thereto. The plurality of conductive landing pads LP may respectively include a plurality of island patterns. In some embodiments, due to an etching process atmosphere accompanied with the formation of the plurality of conductive landing pads LP, partial regions of the plurality of insulating capping patterns 136 and the plurality of insulating spacers 440 on the sidewalls of the plurality of insulating capping patterns 136 may also be removed, the partial regions being around the plurality of insulating spacers 440, whereby the partial regions of the plurality of insulating capping patterns 136 and the plurality of insulating spacers 440 may be reduced in height.

An insulating film 480 may fill spaces around the plurality of conductive landing pads LP, thereby electrically insulating the plurality of conductive landing pads LP from each other. Next, a plurality of capacitor bottom electrodes (not shown), which may be electrically connected to the plurality of conductive landing pads LP, may be formed on the insulating film 480.

Although an example of the method of fabricating the integrated circuit device 400 has been described with reference to FIGS. 9 to 27, integrated circuit devices having various structures may be fabricated by making various modifications and changes to the method described with reference to FIGS. 9 to 27. For example, it will be understood by those skilled in the art that, from the descriptions made with reference to FIGS. 9 to 27, the integrated circuit devices 100B, 100C, 200A, 200B, 300A, and 300B shown in FIGS. 3 to 8, and various integrated circuit devices variously modified and changed therefrom may be fabricated. In particular, to form the integrated circuit device 100C, which includes the polymer spacer 143 filling a space between the inner spacer 142 and the lower insulating portion 144A, as shown in FIG. 4, the process described with reference to FIG. 23A, that is, the process of removing the graft polymer layer 443A and the vertical domain layer 443B may be omitted from the method of fabricating the integrated circuit device, the method having been described with reference to FIGS. 9 to 27.

Figure 28A:
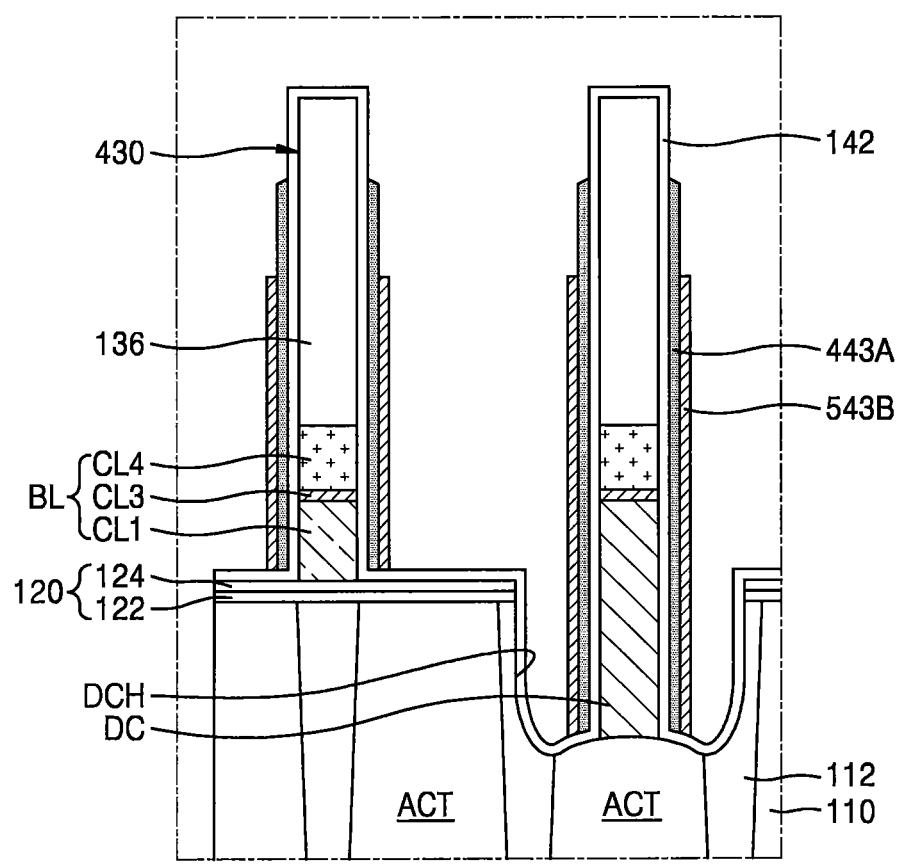
FIGS. 28A and 28B are cross-sectional views illustrating a method of fabricating an integrated circuit device, according to embodiments of the inventive concepts.
Figure 28B:
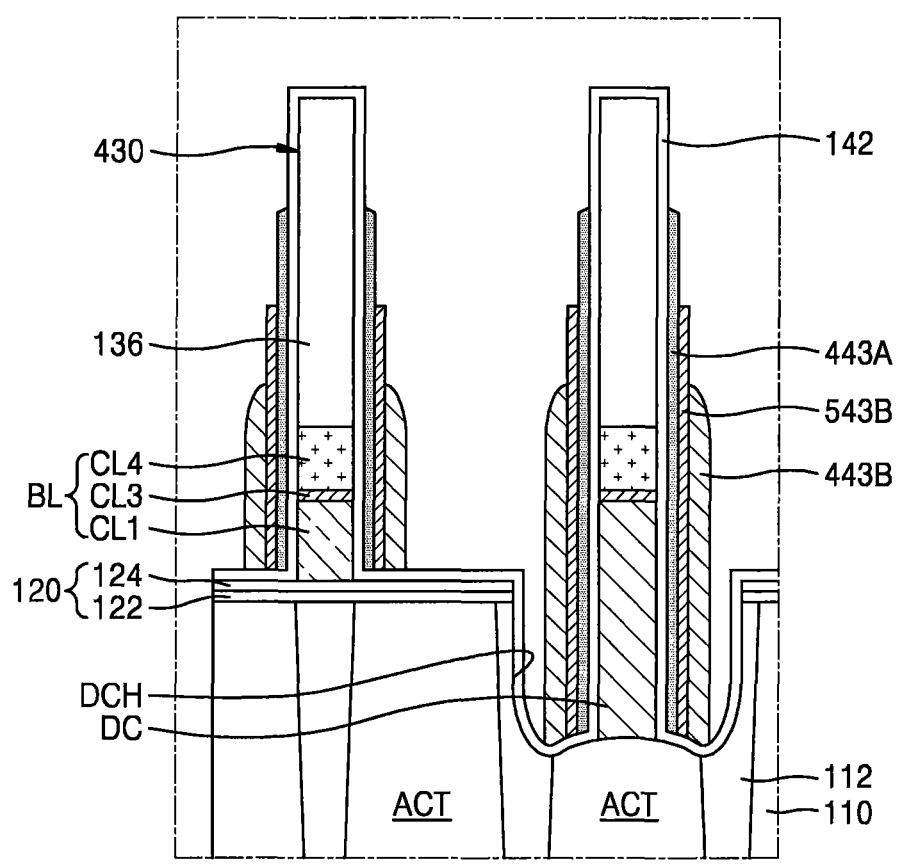

FIGS. 28A and 28B are cross-sectional views illustrating a method of fabricating an integrated circuit device, according to embodiments of the inventive concepts. In FIGS. 28A and 28B, the same reference numerals as in FIGS. 9 to 27 respectively denote the same members, and repeated descriptions thereof will be omitted.

Referring to FIG. 28A, the processes described with reference to FIGS. 9 to 17B may be performed, thereby forming the graft polymer layer 443A on the inner spacer 142, the graft polymer layer 443A on the sidewall of each of the plurality of conductive line structures 430.

Next, the processes described with reference to FIGS. 16A to 17B may be repeated again, thereby forming an additional graft polymer layer 543B on the graft polymer layer 443A, the additional graft polymer layer 543B on the sidewall of each of the plurality of conductive line structures 430. However, the additional graft polymer layer 543B may have a height less than the height of the graft polymer layer 443A.

Referring to FIG. 28B, the processes described with reference to FIGS. 18A to 20B may be performed on a result product of FIG. 28A, thereby forming the vertical domain layer 443B on the additional graft polymer layer 543B, the vertical domain layer 443B on the sidewall of each of the plurality of conductive line structures 430.

Next, the processes described with reference to FIGS. 21A to 27 may be performed, thereby fabricating the integrated circuit device.

According to the method of fabricating the integrated circuit device, which has been described with reference to FIGS. 28A and 28B, when the first insulating spacer film 444L, which covers the graft polymer layer 443A, the additional graft polymer layer 543B, and the vertical domain layer 443B, is formed in the same manner as described with reference to FIGS. 21A and 21B, a portion of the first insulating spacer film 444L, which is on, and in some embodiments, covers the sidewall of each conductive line structure 430, may have a structure in which a surface step is relatively gentle (e.g., inclined at a small angle with respect to a perpendicular line normal to the substrate 110). Thus, a structure, in which a space defined by the insulating spacers 440 between two adjacent conductive line structures 430 has a gently increasing width with increasing distance from the substrate 110, may be obtained.

According to the methods of fabricating the integrated circuit devices, according to embodiments of the inventive concepts, a structure, in which an insulating spacer 440 including the air spacer AS or the polymer spacer 143 between each conductive line structure 430 and the plurality of conductive plugs 460 extends in a length direction of the bit line BL, may be obtained, the air spacer AS or the polymer spacer 143 having an extremely low dielectric constant. Therefore, a structure capable of minimizing load capacitance between a plurality of conductive patterns in a unit cell due to high integration may be provided. In addition, in forming the air spacer AS between each conductive line structure 430 and the plurality of conductive plugs 460, the air spacer AS may be formed before the metal silicide film 472 and the conductive landing pad LP are formed on each conductive plug 460. Therefore, deterioration in the quality of the integrated circuit device may be prevented by preventing the spread of contamination due to the air spacer AS or surroundings thereof during the process of forming the air spacer AS, as compared with the case where the air spacer AS is formed after the metal silicide film 472 and the conductive landing pad LP are formed.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings While the inventive concepts have been particularly shown and described with reference to embodiments thereof, it will be understood that various changes in form and details may be made therein without departing from the spirit and scope of the following claims.

What is claimed is:

1. An integrated circuit device comprising:
   a conductive line structure comprising a conductive line and an insulating capping pattern that is on the conductive line, the conductive line extending in a first horizontal direction over a substrate; and
   an insulating spacer comprising an inner spacer and a first insulating spacer on the inner spacer, the inner spacer contacting a sidewall of the conductive line structure, and the first insulating spacer on the sidewall of the conductive line structure,
   wherein the first insulating spacer comprises:
   a slit portion extending in the first horizontal direction on the substrate;
   a lower insulating portion extending in the first horizontal direction between the substrate and the slit portion and spaced apart from the inner spacer such that a separation distance between a portion of the lower insulating portion and the inner spacer decreases with increasing vertical distance from the substrate; and
   an upper insulating portion contacting the inner spacer and spaced apart from the lower insulating portion with the slit portion therebetween,
   wherein the inner spacer is between the substrate and a lowermost surface of the first insulating spacer in a direction normal to a top surface of the substrate.

2. The integrated circuit device according to claim 1, wherein the lower insulating portion extends adjacent the conductive line, and
   wherein the upper insulating portion extends adjacent the insulating capping pattern.

3. The integrated circuit device according to claim 1, wherein the lower insulating portion defines a first insulating region between the lower insulating portion and the inner spacer at a first level adjacent the conductive line, and defines a second insulating region between the lower insulating portion and the inner spacer at a second level adjacent the insulating capping pattern, the first insulating region having a first width, and the second insulating region having a second width that is less than the first width, and
   wherein the first insulating region is physically connected with the second insulating region.

4. The integrated circuit device according to claim 3, wherein the insulating spacer further comprises an air spacer within the first insulating region and the second insulating region.

5. The integrated circuit device according to claim 3, wherein the insulating spacer further comprises a polymer spacer within the first insulating region and the second insulating region.

6. The integrated circuit device according to claim 5, wherein the polymer spacer comprises:
   a graft polymer layer within the first insulating region and the second insulating region, the graft polymer layer being chemically bonded to the inner spacer; and
   a vertical domain layer within the second insulating region, the vertical domain layer including a polymer block self-assembled onto the graft polymer layer.

7. The integrated circuit device according to claim 3, wherein an uppermost portion of the lower insulating portion is spaced apart from the inner spacer, the uppermost portion and the upper insulating portion defining the slit portion.

8. The integrated circuit device according to claim 3, wherein an uppermost portion of the lower insulating portion contacts the inner spacer, the uppermost portion and the upper insulating portion defining the slit portion.

9. The integrated circuit device according to claim 3, wherein the lower insulating portion and the first insulating region extend to a lower level than a top surface of the substrate.

10. The integrated circuit device according to claim 1, wherein the insulating spacer further comprises a second insulating spacer on the sidewall of the conductive line structure, with portions of the first insulating spacer being between the second insulating spacer and the conductive line structure, and
wherein the second insulating spacer penetrates the slit portion.

11. The integrated circuit device according to claim 10, wherein the second insulating spacer comprises an insertion portion penetrating the slit portion and extending to a space between the inner spacer and the lower insulating portion.

12. The integrated circuit device according to claim 1, further comprising:
a contact structure adjacent the conductive line structure, with the insulating spacer therebetween,
wherein, in a second horizontal direction perpendicular to the first horizontal direction, a first portion of the contact structure has a third width, and a second portion of the contact structure has a fourth width that is greater than the third width, the first portion adjacent the lower insulating portion, and the second portion adjacent the upper insulating portion, and
wherein the upper insulating portion is between the second portion of the contact structure and the inner spacer in the second horizontal direction.

13. An integrated circuit device comprising:
a pair of immediately adjacent conductive line structures comprising a pair of conductive lines and a pair of insulating capping patterns that are on the pair of conductive lines, the pair of conductive lines extending in a first horizontal direction over a substrate;
a plurality of contact structures arranged in a line between the pair of conductive line structures; and
a plurality of insulating spacers arranged between the pair of conductive line structures and the plurality of contact structures,
wherein each of the plurality of insulating spacers comprises:
an inner spacer contacting a sidewall of each conductive line structure of the pair of conductive line structures; and
a first insulating spacer comprising a slit portion, a lower insulating portion between the substrate and the slit portion, and an upper insulating portion,
wherein the slit portion extends in the first horizontal direction,
wherein the lower insulating portion extends in the first horizontal direction and is spaced apart from the inner spacer such that a separation distance between a portion of the lower insulating portion and the inner spacer decreases with increasing vertical distance from the substrate, and
wherein the upper insulating portion contacts the inner spacer and is spaced apart from the lower insulating portion, with the slit portion therebetween.

14. The integrated circuit device according to claim 13, wherein each of the plurality of insulating spacers further comprises an air spacer between the inner spacer and the lower insulating portion.

15. The integrated circuit device according to claim 13, wherein each of the plurality of insulating spacers further comprises a polymer spacer between the inner spacer and the lower insulating portion, and
wherein the polymer spacer comprises a graft polymer layer that is chemically bonded to the inner spacer, and a vertical domain layer comprising a polymer block that is self-assembled onto the graft polymer layer.

16. The integrated circuit device according to claim 13, wherein the lower insulating portion defines a first insulating region between the lower insulating portion and the inner spacer at a first level adjacent each conductive line of the pair of conductive lines, and defines a second insulating region between the lower insulating portion and the inner spacer at a second level facing each insulating capping pattern of the pair of insulating capping patterns, the first insulating region having a first width, and the second insulating region having a second width that is less than the first width, and
wherein the first insulating region is physically connected with the second insulating region.

17. The integrated circuit device according to claim 16, wherein an upper portion of the lower insulating portion extends in a vertical direction with respect to a top surface of the substrate, the upper portion defining the second insulating region.

18. The integrated circuit device according to claim 16, wherein an upper portion of the lower insulating portion extends in an inclined direction such that the upper portion becomes closer to the inner spacer with increasing distance from the substrate, the upper portion defining the second insulating region.

19. The integrated circuit device according to claim 16, wherein an uppermost portion of the lower insulating portion contacts the inner spacer.

20. An integrated circuit device comprising:
a conductive line structure comprising a conductive line and an insulating capping pattern that is on the conductive line, the conductive line extending in a first direction on a substrate;
an inner spacer on a sidewall of the conductive line structure;
a first insulating spacer on the inner spacer, wherein the first insulating spacer comprises:
a lower insulating portion extending in the first direction adjacent the conductive line; and
an upper insulating portion extending in the first direction adjacent the insulating capping pattern; and
a second insulating spacer on the first insulating spacer and the inner spacer, the second insulating spacer comprising:
a first portion that is spaced apart from the inner spacer by the upper insulating portion of the first insulating spacer; and
a second portion that is between the lower insulating portion of the first insulating spacer and the inner spacer,
wherein the lower insulating portion is separated from the upper insulating portion by a gap, and wherein a first distance between an upper portion of the lower insulating portion and the inner spacer is less than a second distance between a lower portion of the lower insulating portion and the inner spacer.

* * * * *